United States Patent [19]

Lemson

[11] Patent Number: 5,678,198
[45] Date of Patent: *Oct. 14, 1997

[54] SYSTEM FOR CONTROLLING SIGNAL LEVEL AT BOTH ENDS OF A TRANSMISSION LINK, BASED UPON A DETECTED VALUE

[75] Inventor: Paul H. Lemson, Redmond, Wash.

[73] Assignee: Southwestern Bell Technology Resources, Inc., Austin, Tex.

[*] Notice: The term of this patent shall not extend beyond the expiration date of Pat. No. 5,321,849.

[21] Appl. No.: 440,976

[22] Filed: May 15, 1995

Related U.S. Application Data

[63] Continuation-in-part of Ser. No. 257,903, Jun. 13, 1994, Pat. No. 5,457,811, which is a continuation of Ser. No. 704,114, May 22, 1991, Pat. No. 5,321,849.

[51] Int. Cl.⁶ .................................................... H04B 1/16
[52] U.S. Cl. .............. 455/67.1; 455/235.1; 455/249.1; 455/282; 455/289; 455/291; 359/194; 370/202
[58] Field of Search .................. 455/13.4, 14, 67.1, 455/67.5, 70, 72, 234.1, 234.2, 235.1, 249.1, 253.2, 254, 281–283, 289, 291, 295; 333/17.2; 359/194; 370/7, 202; 375/296

[56] References Cited

U.S. PATENT DOCUMENTS

| 3,444,469 | 5/1969 | Miyagi . |
| 3,456,191 | 7/1969 | Rodenburg et al. . |
| 3,619,786 | 11/1971 | Wilcox . |
| 3,912,946 | 10/1975 | Graziadei . |
| 4,004,224 | 1/1977 | Arens et al. . |

(List continued on next page.)

FOREIGN PATENT DOCUMENTS

| 259153 | of 0000 | Argentina . |
| 0039641 | 4/1981 | Japan . |
| 0035844 | 2/1985 | Japan . |

OTHER PUBLICATIONS

Wala, Philip M., "A New Microcell Architecture Using Digital Optical Transport", Proceedings of IEEE Vehicular Technology Conference, pp. 585–588, May 1993.

Ehrlich et al., "Cell–Site Hardware," *The Bell System Technical Journal*, Jan. 1979, pp. 153–199.

Fye, "Design of Fiber Optic Antenna Remoting Links for Cellular Radio Applications," *Proceedings of VTC '90*, May 1990, pp. 622–625.

Cheng, "Ultra Wide Band Analog Signal Processor Products," *RF Design*, pp. 42–52, Sep. 1994.

Olmstead et al., "Digital IF Processing," *RF Design*, pp. 30–40, Sep. 1994.

Steinbrecher, "Some Implementation Limits Governing the Design of Digital Receivers," *Wireless Symposium & Exhibition '93*, Jan. 12–15, 1993.

(List continued on next page.)

*Primary Examiner*—Chi H. Pham
*Attorney, Agent, or Firm*—Greenblum & Bernstein, P.L.C.

[57] ABSTRACT

The present invention is directed to a dynamic range enhancing system for increasing the dynamic range of a transmission link, characterized as either an analog or digital link. The system includes a pre-processing unit, provided at a first location, that receives, as input, a transmit signal, and a post-processing unit, provided at a second location, remote from the first location, that receives, as input, a signal transmitted over the transmission link. The pre-processing unit includes a first signal level adjusting device for adjusting a signal level of the transmit signal to be transmitted over the transmission link and a control signal maybe provided for controlling the post-processing unit, and the post-processing unit includes a second signal level adjusting device for adjusting a signal level of the adjusted transmit signal transmitted over said transmission link. The transmit signal and the control signal maybe combined and transmitted over the transmission link together so as to eliminate synchronization problems. In this arrangement the overall system gain remains substantially constant.

71 Claims, 13 Drawing Sheets

U.S. PATENT DOCUMENTS

| | | |
|---|---|---|
| 4,169,219 | 9/1979 | Beard . |
| 4,188,587 | 2/1980 | Palmer . |
| 4,270,222 | 5/1981 | Menant . |
| 4,355,304 | 10/1982 | Kasuga et al. . |
| 4,457,020 | 6/1984 | King . |
| 4,476,573 | 10/1984 | Duckeck . |
| 4,482,973 | 11/1984 | Unagami et al. . |
| 4,531,234 | 7/1985 | Bell . |
| 4,545,075 | 10/1985 | Miller et al. . |
| 4,553,105 | 11/1985 | Sasaki . |
| 4,654,891 | 3/1987 | Smith . |
| 4,658,296 | 4/1987 | Beech . |
| 4,665,560 | 5/1987 | Lange . |
| 4,722,081 | 1/1988 | Fujito et al. . |
| 4,754,495 | 6/1988 | Kawano et al. . |
| 4,769,853 | 9/1988 | Goodwin et al. . |
| 4,772,956 | 9/1988 | Roche et al. . |
| 4,811,423 | 3/1989 | Eastmond . |
| 4,849,711 | 7/1989 | Leis et al. . |
| 4,859,964 | 8/1989 | Jorgensen . |
| 4,893,300 | 1/1990 | Carlin et al. . |
| 4,910,791 | 3/1990 | Dickinson et al. . |
| 4,947,459 | 8/1990 | Nelson et al. . |
| 5,067,147 | 11/1991 | Lee . |
| 5,321,849 | 6/1994 | Lemson . |

OTHER PUBLICATIONS

Gilders, "Telecosm—The New Rule of Wireless," *Forbes ASAP*, pp. 96–110, Mar. 29, 1993.

ADC Kentrox, "Technology Backgrounder–ADC Kentrox Citycell 824," Mar. 29, 1993.

Wala, "A New Microcell Architecture Using Digital Optical Transport," *Proceedings of IEEE Vehicular Technology Conference*, pp. 585–588, May 1993.

Lytle, "Emerging Technologies—Digital Conversion at Light Speed," *Photonics Spectra*. p. 44, Oct. 1993.

Sorenson et al., "Cellular Operators call on Fiber for Help," *Lightwave*, pp. 30 and –32, Jan. 1994.

Gilders, "Telecosm—Auctioning the Airways," *Forbes ASAP*, pp. 98–112, Apr. 11, 1994.

Claasen et al., "Signal Processing Method for Improving the Dynamic Range of A/D and D/A Converters," *IEEE Transaction on Acoustics, Speech and Signal Processing*, vol. ASSP–28, No. 5, pp. 529–538, Oct. 1980.

Saulnier, et al., "A VLSI Demodulator for Digital RF Network Applications: Theory and Results," *IEEE Journal on Selected Areas in Communications*, vol. 8, No. 8, pp. 1505–1509, Oct. 1990.

"Solutions for Cellular Radio Base Stations," *Analog Devices Brochure*, (G1880–5–Feb. 1994), Norwood, MA.

Baines et al., "The Soft Approach," *Telephony*, pp. 20 and 22, Jul. 25, 1994.

Stremler, Introduction to Communications Systems, Addison–Wesley Publishing Co., Dec. 1982, pp. 154–155.

Meyer, "Using Fiber Optics with Analog R.F. Signals," *Proceedings of VTC '89*, May 1989, pp. 398–400.

Pan, "Fiber Optics Marches into Microwave Systems," *Microwave Journal*, Aug. 1982, pp. 93–98.

Carlin et al., "Direct Fiber Optic Transmission of a Wideband Multi–Carrier Microwave Signal Spectrum to and from Satellite Earth Station Antennas," *1987 IEEE MTT-S Digest*, Jun. 1987, pp. 885–887.

Heim et al., "Frequency Division Multiplexed Microwave and Baseband Digital Optical Fiber Link for Phased Array Antennas," *IEEE Transactions on Microwave Theory and Techniques*, vol. 38, No. 5, May 1990, pp. 494–500.

Bernhardt, "The Effect of Path Loss Models on the Simulated Performance of Portable Radio Systems," *Proceedings of Globecom '89*, Nov. 1989, pp. 1356–1360.

Darcie et al., "Lightwave Subcarrier CATV Transmission Systems," *IEEE Transactions on Microwave Theory and Techniques*, vol. 38, No. 5, May 1990, pp. 524–533.

Way, "Frequency–dependent and Frequency–independent Nonlinear Characteristics of a High–speed Laser Diode," *1988 IEEE MTT-S Digest*, Jun. 1988, pp. 991–994.

Howat, "Cell like Performance Using the Remotely Controlled Cellular–Transmitter," *Proceedings of VTC '89*, May 1989, pp. 535–541.

Ramadan, "Analog Signals Transmission over Optical Fiber Systems," *1985 IEEE MTT-S Digest*, Jun. 1985, pp. 303–306.

Koscinski, "Transmission of Analog FDM Signals on Fiber Optical Links" *RF Design*, Apr. 1987, pp. 31–41.

McKay, "Moving RF over Fiber Optics," *Communications*, Oct. 1988, pp. 30–36.

Andermo, "RACE Mobile," *Record of Second Rutgers Workshop on Third Generation Wireless Information Networks*, Oct. 1990, pp. 14–24.

Motorola's Reply Comments filed before FCC in general docket 89–354, Oct. 27, 1989, Table 2.

Way, "Subcarrier Multiplexed Lightwave System Design Considerations for Subscriber Loop Applications," *IEEE Journal of Lightwave Technology*, vol. 7, No. 11, Nov. 1989, pp. 1806–1818.

Cooper, "Fibre/Radio for the Provision of Cordless/Mobile Telephony Services in the Access Network," *Electronics Letters*, vol. 26, No. 4, Nov. 22, 1990, pp. 2054–2056.

Chu and Gans, "Fiber Optic Microcellular Radio," *Proceedings of VTC '91*, May 1991, pp. 339–344.

Seidel and Rappaport, "900 MHz Path Loss Measurements and Prediction Techniques for In–Building Communication System Design," *Proceedings of VTC '91*, May 1991, pp. 613–618.

Merritt, et al., "A Cordless Access System using Radio–over–Fibre Techniques," *Proceedings of VTC '91*, May 1991, pp. 921–924.

Harvey, et al., "Cordless Communications Utilising Radio over Fibre Techniques for the Local Loop," *Proceedings of ICC '91*, Jun. 1991, pp. 1171–1175.

Shibutani, et al., "Feasibility Studies on an Optical Fiber System for Microcellular Mobile Communications Systems," *Proceedings of ICC '91*, Jun. 1991, pp. 1176–1181.

Grimlund et al., "Handoff Strategies in Microcellular Systems," *Proceedings of VTC '91*, May 1991 pp. 505–510.

NYNEX Document, "NYNEX Automated Position Correlated Measurement System—NAPCOMS" (Oct. 30, 1991).

Young, "Fiber Links to Microcells," *Cellular Business* (Nov. 1991).

Leff, "Microwave Microcell," *Cellular Business* (Nov. 1991).

Tang, "Fiber Optic Antenna Remoting for Multi–Sector Cellular Cell Sites," GTE Laboratories.

SYSTEM FOR CONTROLLING SIGNAL LEVEL AT BOTH ENDS OF A TRANSMISSION LINK, BASED UPON A DETECTED VALUE

CONTINUING DATA

The present invention is a continuation-in-part of U.S. patent application Ser. No. 08/257,903, filed on Jun. 13, 1994, entitled "System for Controlling Signal Level at Both Ends of a Transmission Link Based on a Detected Value", now U.S. Pat. No. 5,457,811 which is a continuation of Ser. No. 07/704,114 filed May 22, 1991 LEMSON, U.S. Pat. No. 5,321,849, issued on Jun. 14, 1994, entitled "System for Controlling Signal Level at Both Ends of a Transmission Link Based on a Detected Value", and the disclosures of both documents are expressly incorporated herein by reference in their entirety.

BACKGROUND OF THE INVENTION

1. Technical Field of the Invention

The present invention relates to a dynamic range enhancing system for increasing the dynamic range of a transmission link. More particularly, the present invention is directed to a dynamic range enhancing system, and a process for increasing the dynamic range of a transmission link, to thus increase the useable RF input range of the transmission link. The dynamic range enhancing system and process for increasing the dynamic range of a transmission link of the present invention are particularly well suited for use, e.g., in analog or digital transmission links; however, the scope of potential uses is not limited to the same, and a wide variety of applications are presently intended, such as those enumerated herein below.

2. Discussion of Background Information

U.S. Pat. No. 5,321,849, which issued in the name of the present inventor, discloses a dynamic range enhancing system, one embodiment of which is shown in FIG. 1 herein. This embodiment of the invention in U.S. Pat. No. 5,321,849 adjusts the power level of an input RF or analog signal, before and after transmission through a transmission link, to increase the dynamic range of the transmission link by reducing the input distortion due to intermodulation noise.

The system utilizes a pair of variable gain amplifiers 32 and 34 disposed at either end of a transmission link. A signal pre-processing unit of this system includes a power detector/controller 42 and a control signal modulator 44 at a first end 26 of the transmission link 22. A system RF or analog input signal 36 is applied to the input of an RF preamplifier 24, and the output 40 of the preamplifier 24 is connected to a gain control amplifier 32 and to the power detector/controller 42 at an input 43a. A first output 43b of power detector/controller 42 is connected to a programming control input 33 of gain control amplifier 32. Control signal modulator 44 is connected at its input to a second output 43c of power detector/controller 42, and is connected at its output to an input 26' of transmission link 22. The output of gain control amplifier 32 is coupled to the transmission link 22 at first end 26.

A signal post-processing unit includes a control signal demodulator 46 located at a remote end 30 of the transmission link 22. The input of control signal demodulator 46 and the input to gain control amplifier 34 are coupled to the remote end 30 of transmission link 22. The programmable control input 35 of gain control amplifier 34 is coupled to the output of control signal demodulator 46. The system RF or analog output signal 38 is taken from the output of gain control amplifier 34.

The control signals emitted by control device 42 at first and second outputs 43b and 43c may comprise either analog or digital signals, depending upon the configuration and type of gain control amplifiers used for first and second signal level changing devices 32 and 34. The system is configured to transmit a feedforward control signal over transmission link 22 to control a second signal level changing device 34. The control signal modulator 44 accepts control information as an input and generates a second control signal, e.g., an RF carrier modulator either employing an analog or digital technique, to be transmitted over the transmission link. A potential disadvantage of this approach is the complexity of control signal modulator 44. At the distant end of the transmission link 22, the control signal demodulator 46 demodulates the control signal and recovers the control information, in turn providing means to control the power level of RF or analog output signal 38 by adjusting the gain of gain control amplifier 34 at the remote end 30 of the transmission link 22.

In particular, a second of the two control signals produced by control device 42, which is intended to control second gain control amplifier 34, enters control signal modulator 44, which in turn produces an RF carrier modulated by the second control signal. The modulation type may be FM (frequency modulation), FSK (frequency shift keying), PM (phase modulation), PSK (phase shift keying), AM (amplitude modulation), ASK (amplitude shift keying), or any combination of these, as may implemented by one of ordinary skill in the art and as the particular application may dictate. This resulting modulated RF second control signal is then coupled along with the processed RF transmit input signal (i.e., the signal which is already pre-transmission processed by first gain control amplifier 32) into transmission link 22 at the input of a light emitting or laser diode modulator (whichever is used as part of link 22; neither is shown, however). The frequency of the RF carrier generated by control signal modulator 44 is typically selected to avoid interfering with any of the desired system input signals present in the RF transmit signal. It is significant to note that the control signal is injected into the signal path after gain control device 32.

The combined signal, comprised of the system RF or analog input signal processed by first signal level changing device 32 and the modulated second control signal, is then converted to an optical intensity-modulated signal and subsequently transmitted over transmission link 22, which may be an optical fiber cable link within the general applicable scope of the present invention (i.e., any transmission link which needs a system for increasing its dynamic range by decreasing intermodulation distortion effects caused at some point in the transmission link).

Both signals are located at output 30 of transmission link 22, and are simultaneously converted back to RF signals by, e.g., a photo detector (in the case of an optical link). A sample of the signal at output 30 of transmission link 22 is fed into control signal demodulator 46, wherein an internal filter selects only the desired control signal, which is demodulated.

Typically, the level of the transmitted control signal is quite low with respect to most desired system input signals, since the RF control signal is not subjected to multipath impairments and typically can be properly demodulated even if it has a low input signal-to-noise ratio (such as 30 dB for most digital signal modulation formats). A low level control signal ensures low intermodulation distortion in the transmit signal, which may be caused by the control signal itself.

After demodulation of the control signal, if necessary, control signal demodulator 46 further processes the analog or digital control signal to be in correct format to be able to alter the setting of gain control amplifier 34.

In the basic operation of the previous system, as shown in FIG. 1, an RF or analog input signal 36 is adapted to be pre-processed by the system for transmission over transmission link 22. Control device 42 detects the instantaneous composite power at the output 40 of preamplifier 24 and generates two control signals for the purpose of setting, or adjusting, the gain levels of gain control amplifiers 32 and 34. If the power level of the RF or analog signal present at output 40 of preamplifier 24 is extremely low, and below a preset first input power threshold, control device 42 sets the gain of control gain amplifier 32 to a given high value and simultaneously sets the gain of control amplifier 34 to a given low value (typically near the low end of its control range).

If the system RF or analog input system power, detected by the control device 42, increases slightly, the gain settings of control gain amplifiers 32 and 34 remain fixed at their present existing gain values. However, if the RF or analog input power detected by control device 42 slowly and continuously rises (due to a continuous increase in system RF input power) to a level above a predetermined first threshold, control device 42 will adjust the gain level of gain control amplifier 32 to a lower gain value than its previous setting, based on the maximum value of power which should be present at input 26 of transmission link 22.

For every one dB increase of system RF system input power at system input 36, the gain setting of gain control amplifier 32 decreases by one dB. Almost simultaneously, control device 42 generates a control signal at output 43c to set gain control amplifier 34 to a higher level of gain than previously set, the change in gain being the same as the change in gain for amplifier 32. For every one dB of increase in system RF input power at system input 36, the gain setting of gain control amplifier 34 increases by one dB.

As gain control amplifiers 32 and 34 respond by changing their respective RF gain levels equally and oppositely, the net system gain (or loss) between system input 36 and system output 38 remains constant. Likewise, as the system input power level at system input 36 rises, the RF system power at input 26 of transmission link 22 remains nearly constant.

If the power at preamplifier output 40, as detected by control device 42, is above the first threshold, control device 42 calculates the amount by which the power detected at output 40 of preamplifier 24 exceeds the predetermined threshold. If, for example, the power detected is 5 dB above the threshold, control device 42 decreases the gain setting of gain control amplifier 32 by 5 dB below its given zero input power setting, and simultaneously increases the gain setting of gain control amplifier 34 by 5 dB above its given zero input power setting.

If the system RF input power level at preamplified output 40 continually rises past the point (i.e., a second threshold value) where second gain control amplifier 34 has already been set to its maximum gain, control device 42 may optionally be programmed to set gain control amplifier 34 at the maximum gain end of its adjustment range, and to continue to meanwhile decrease the gain of gain control amplifier 32 by one dB for each one dB increase of system RF power level. In this mode, control device 42 continues to compensate for increasing input power until gain control amplifier 32 reaches its minimum gain setting, thereby resulting in both gain control amplifiers 32 and 34 being set to constant amplification levels. The point at which control amplifier 32 reaches its minimum gain setting is when the system RF input power level reaches a third threshold value.

Thus, when the input power level is below a first threshold, both signal level changing devices 32 and 34 are set to a constant gain level. When the input power level is between the first threshold and a second threshold, the first signal level changing device is set to decrease the relative power level of the transmit signal present at input 26 of transmission link 22, and the second signal level changing device is set to increase the signal level present at system output 38. When the input power level is between second and third thresholds, only the first signal level changing device is active (i.e., it changes its setting to compensate for a change in input signal level). When the input power level is above the third threshold, neither signal level changing device is active (i.e., adjustable to affect the signal level).

The system described in U.S. Pat. No. 5,321,849 was directed to applications where analog and/or digital RF control signals were transmitted over a generic transmission link, e.g., over an intensity modulated subcarrier multiplex analog optical fiber link. While the basic characteristics and features of the system are applicable for use with either analog or digital links, the illustrated embodiments were directed toward use with analog transmission links, such as utilized for RF transmission between radio-base stations e.g., radio transmitters and receivers, and remote antennas. The system was directed to minimizing the instantaneous signal amplitude excursion which potentially causes intermodulation and other types of distortion, thereby degrading transmission link performance.

One specific example shown in U.S. Pat. No. 5,321,849 was an optical transmission link comprising a laser diode. Commercial analog optical fiber systems have existed for many years, and the overall performance of these systems is dependent upon the physical composition of the transmission link. Unfortunately, as the physical length of such an analog transmission link increases, the performance of the system and signal carrying abilities deteriorate.

The previous system traded bandwidth necessary to transmit the desired signal in order to improve the overall signal handling capability of an analog/RF transmission link. That is, the system effectively expanded the original bandwidth of the input signal as the input signal was processed.

Currently, commercial systems are addressing applications for transmitting analog or digital RF signals over a digital transmission link, e.g., a digital fiber optic link, such as those widely deployed by telephone companies. These systems require analog or digital RF input signals to be converted into a digital bit stream for transmission over the digital transmission link, and then typically require the signals to be converted back to analog or digital RF format when received at the remote end of the digital transmission link. This type of transmission facility may be utilized between radio base station equipment, e.g. radio transmitters and receivers, and remote antennas. Some examples of digital transmission facilities are digital radio links, digital optical fiber transmission, T1 coaxial cable facilities, or twisted pair facilities which are specially equipped for digital transmission.

While the primary advantage of the digital transmission link approach is that it does not suffer from the previously described drawbacks of the analog transmission link, i.e., the link performance is not degraded by the relatively longer physical length of the transmission link, many other advantages are also available. Recent years have seen increasing deployment of new digital transmission facilities by telecommunications providers, common carriers, and private companies, particularly in metropolitan areas. Because digital facilities are not subject to the same impairments as analog transmission facilities, and digital optical fiber facilities are less susceptible to diminution in signal integrity due to splicing and/or tapping, while providing improved switching and protection against outages, their use in the above-mentioned areas is desirable. Another added advantage is that since multiple digital signals are time division multiplexed rather than frequency division multiplexed, there is no potential intermodulation or harmonic distortion impairment.

However, these general advantages of the digital transmission systems for this application are nonetheless hindered by the economic reality of a higher present cost for system hardware. Often times, the transmission links used for transmitting the digital information are not owned by the user. That is, the user pays rent to the transmission link owner for the right to use the link in transmitting the RF or analog input signal through the system. The rent paid by the user generally relates to the time and/or transmission rate required to completely transmit the signal.

Use of digital transmission facilities has recently been proposed for remote antenna applications. ADC Kentrox, Portland, Oreg., has employed subsystems based upon technologies developed by Steinbrecher Corp., Woodburn, Mass. This remote antenna technique involves use of an analog-to-digital converter which is capable of digitizing a large number of signals with arbitrary modulation types and bandwidth at the remote antenna location. In this regard, reference is made to "Technology Backgrounder—ADC Kentrox CityCell 824," ADC Kentrox, March 1993, and "Some Implementation Limits Governing The Design of Digital Receivers," Wireless Symposium & Exhibition '93, San Jose, Calif., D. H. Steinbrecher, Jan. 12–15, 1993, the disclosures of which are expressly incorporated herein by reference in their entireties. Digital optical fiber transmission facilities are then utilized to transport the resulting digital information stream to the radio base station location, where the composite digital signal is further processed and converted back to analog information, or demodulated. However, when the amplitude of an input signal is too large, i.e., when it is outside the converter's amplitude range for digitizing, a conventional analog-to-digital converter will be forced to limit the amplitude of the input signal, thereby introducing significant AM/AM distortion to the transmission signal. This distortion is obviously transmitted through the digital transmission link with the input signal, and interferes with the integrity of the output signal at the receiving end of the transmission link.

Digital transmission links are not normally considered to be limited by their dynamic range, due to the nature of the transmitted signals. A digital transmission link typically transmits time-division multiplexed (TDM) signals which have a relatively constant power level versus time, whereas an analog transmission link typically transmits multiple frequency-division multiplexed signals having arbitrary instantaneous power levels, ranging from very high to very low. Thus, while the dynamic range of the transmission link is not as significant an issue for digital optical fiber links as it is for analog fiber links, the dynamic range of the analog-to-digital converter and the digital-to-analog converter is the significant performance limitation for digital transmission link systems, such as that proposed by ADC Kentrox.

Other digital transmission link system drawbacks are encountered when automatic gain control signal processing is employed in front of the analog-to-digital converter in order to "center" uplink signals into an optimum analog-to-digital converter input range. Automatic gain control processing potentially causes a number of system impairments when one or more uplink signals are strong enough to cause the automatic gain control processor to reduce its gain. These impairments include:

(1) excessive handoffs for weaker mobiles when these mobiles have not physically moved into another cell coverage area, since the signal strength indication for all weaker mobiles will be forced to change as a function of the stronger mobile signal;

(2) AM modulation impressed on all weaker mobiles' signals, if the strong mobile is a time domain multiple access (TDMA) mobile which can cause call quality degradation and/or a dropped call;

(3) overshoot, undershoot, or ringing on the strong uplink signal, which can cause call quality degradation and/or dropped calls;

(4) automatic gain control amplifier AM/AM distortion, due to compression and expansion of the input signal, and AM/PM distortion can degrade call quality;

(5) weaker mobiles are needlessly commanded to increase their transmit power, causing intra-system interference; and (6) signals immediately adjacent to the band of interest from an adjacent channel system may potentially degrade system performance, since the filtering may not protect against the AGC processor's reacting to other system signals; even if notch filters, employed for reacting to the other system signals, are provided after the automatic gain control processor and the first down converter, they would not help solve this problem.

Methods have been suggested for improving the dynamic range of analog-to-digital converters and digital-to-analog converters. For example, Classen et al., "Signal Processing Method for Improving the Dynamic Range of A/D and D/A Converters," *IEEE Transactions on Acoustics, Speech and Signal Processing*, Vol. ASSP-28, No. 5, October 1980, suggests that to enhance performance of an analog-to-digital converter, some preprocessing of the analog input signal is necessary, along with an analog-to-digital converter operating at a higher sampling rate than normal but with a fewer number of bits than normal. In this regard, the above document is expressly incorporated herein by reference in its entirety. The preprocessing may consist of, for example, a predistorter comprising a constant signal adder, an integrator, and a nonlinear device. To recover the transmitted signal, digital post-processing consisting of, for example, a post-distorter to shape the power density of the quantization noise in such a way that only a small part of the noise power will fall inside the signal band. To enhance performance of a digital-to-analog converter, digital preprocessing is employed followed by analog post-processing after transmission. These approaches may be employed to either an analog-to-digital converter, a digital-to-analog converter, or both. For further information regarding analog-to-digital and digital-to-analog converters, see "Ultra Wide Band Analog Signal Processor Products," RF Design, W. W. Cheng, pp. 42–52, September 1994, and "Digital IF Processing," RF Design, C. Olmstead et al., pp. 30–40, September 1994, both articles being expressly incorporated herein by reference in their entireties.

Other systems have sought to reduce the transmission rate for a digitally modulated signal. One method is analogous to the method known as companding, described, for example, in KASUGA et al., U.S. Pat. No. 4,355,304. In this regard, U.S. Pat. No. 4,355,304 is expressly incorporated herein by reference in its entirety. While addressing certain concerns for reducing transmission rates for digitally modulated signals, the companding approach is subject to compression/ expansion errors and transient response problems. Such systems reduce the digital transmission rate by converting the analog input signal to a digital signal by employing an analog-to-digital converter with a lower than normal number of resolution bits. The digital signal is next processed by a variable gain circuit to perform a level compression. At the distant end of the digital transmission link, an expander, comprising of a variable gain circuit, varies the analog conversion level of the modulated digital signal to perform an opposite operation to that performed by level compression. A digital-to-analog converter then converts the signal back to an analog signal.

In contrast to the above described systems, the dynamic range enhancing system and process for increasing the dynamic range of a transmission link, according to the present invention, overcomes the above-mentioned drawbacks and problems of prior systems and provide a number of advantages, as discussed more fully hereinafter.

OBJECTS OF THE INVENTION

An object of the present invention is to provide a system for enhancing the overall dynamic input signal range of a transmission link and reducing distortion or diminution in signal integrity due to transmission of the signal. Further, an object of the present invention is to enhance the dynamic range of analog transmission links and/or digital transmission links.

In accordance with one aspect of the present invention, when an analog transmission link is utilized, the system enhances or increases the overall dynamic input signal range for spurious-free operation of signal transmission. Thus, stability of automatic transmitter power control systems which control the levels of some signals processed by the link may be ensured. Moreover, the enhanced dynamic range characteristic of the present invention reduces the chance of dropped calls for portable terminal users of micro-cellular telephone systems, by preventing undesired intermodulation noise products from falling within the desired radio channel.

In accordance with another aspect of the present invention, when a digital transmission link is utilized, the system enhances the dynamic input signal range of format converters (e.g., analog-to-digital converters and digital-to-analog converters), provided at respective ends of the transmission link. Thus, the RF or analog input signal is adjusted prior to format conversion, ensuring minimum distortion.

A further object of the present invention is to eliminate the need for employment of feedback, feed forward, or pre-distortion linearization techniques, in order to increase the dynamic range of an analog or digital transmission link system.

Yet another object of the present invention is to eliminate the need for utilization of amplifiers with linear and non-linear feedback elements especially in conjunction with digital transmission links, and, therefore, to provide a system which is capable of handling a wider range of input signals than with a typical feedback automatic gain control amplifier, without exhibiting undesirable instability or excessive distortion.

Another object of the present invention is to enhance the dynamic range of a transmission link employing an unmodulated control signal and, thus, eliminate the need for a control signal modulator at the remote transmit end of the transmission link. In accordance with this aspect of the invention, a change in the amplitude of the control signal transmitted over the transmission link is proportional to the instantaneous composite RF or analog input signal amplitude.

In accordance with yet another aspect of the present invention, the control signal is a modulated RF carrier signal transmitted along a transmission link with a pre-processed RF or analog input signal.

Another object of the present invention is to provide a dynamic range enhancing system, wherein the transient response of the transmission system may easily be optimized for a wide range of applications through the use of a predetermined time delay.

Moreover, an object of the present invention is to enhance the overall dynamic range of an analog or digital transmission system without the need for a wide-band feedback loop. For analog link applications employing an optical link, by achieving this object, the present invention allows for the use of lower cost lasers or light emitting diodes with less stringent output linearity and noise characteristics. For digital link applications, employing an analog-to-digital converter and a digital-to-analog converter, by achieving this object, the present invention allows for the improvement of system performance when the signal is transmitted over existing digital facilities, even with extremely demanding requirements for handling high dynamic range signals.

A further object of the present invention is to reduce the sampling rate of signals, thus reducing the cost and complexity of the signal processing required at either end of the transmission link. Accordingly, by achieving this object, the present invention reduces overall cost while achieving the noted advantages.

Another object of the present invention is to enhance overall performance when an analog-to-digital converter and a digital-to-analog converter are employed in a remote antenna system for a cellular telecommunications application where dual mode functionality, e.g., analog FM and digital TDMA, or analog FM and digital CDMA is required.

According to another aspect of the present invention, the dynamic range of both the analog-to-digital converter and the digital-to-analog converter may be enhanced without increasing the degree of overall complexity of the system.

Still another aspect of the present invention is to provide a system in which the sampling rate for the analog-to-digital converter is not required to be as high as that required by prior approaches.

Another object of the present invention is to eliminate the necessity for a synchronizing timing signal to ensure coordination of the control signal adjustment of the transmit signal at the remote end of the digital transmission link.

Another aspect of the present invention is to process a transmitted signal at the remote end of a digital transmission link. In accordance with one aspect of this objective, the transmitted signal is pre-processed by a digital-to-analog converter and adjusted in accordance with the control signal. In accordance with another aspect of this objective, the signal is processed into a digitized transmit signal that is level adjusted in accordance with the control signal.

The transmission links of the present invention may include, e.g., RF transmission links, fiber optic cable links, free-space optical links, radio wave transmission links, digital links, CATV infrastructure, and any combination of the above elements. Other applications of the present invention are tandem fiber optic cable and free-space optical links, potentially using optical repeaters, plural frequency input signals, digital tuners and digital filters employed at the receive end of the links.

SUMMARY OF THE INVENTION

Accordingly, one aspect of the present invention is directed to a dynamic range enhancing system for enhancing performance of a transmission link by controlling a transmit signal to be transmitted along a communication path. The transmission link may extend from a first location to a second location remote from the first location. The system may include a pre-processing unit, provided at the first location, that receives, as input, the transmit signal. The pre-processing unit may include a first signal level adjusting device for adjusting a signal level of the transmit signal to be transmitted over the transmission link, and a device for transmitting the adjusted transmit signal over the transmission link. A post-processing unit, provided at the second location, that receives, as input, the adjusted transmit signal transmitted over the communication link. The post-processing unit may include a second signal level adjusting device for adjusting a signal level of the adjusted transmit signal transmitted over the transmission link. The pre-processing unit further may include a control device for controlling the first signal level adjusting device and the second signal level adjusting device, such that the overall system gain is substantially constant. The control device may include a device for detecting the signal level of the transmit signal at an input of the pre-processing unit, a device for generating a first control signal for controlling the first signal level adjusting means based on the signal level detected by said detecting device and a device for generating a second control signal for controlling the second signal level adjusting device based on the signal level detected by the detecting device. The second control signal may include a constant amplitude signal. The system may also include a combining device for combining the transmit signal and the second control signal before the transmit signal has been adjusted by the first signal level adjusting device, and a device for transmitting the second control signal with the adjusted transmit signal over the transmission link to the post-processing unit.

In accordance with another aspect of the present invention, the system may also include a format converting device for converting an analog signal into digital form, wherein the transmit signal is converted before being transmitted over the transmission link.

In accordance with a further aspect of the present invention, the first signal level adjusting device may include a gain controlled amplifier, wherein a gain of the gain controlled amplifier is adjusted according to the first control signal.

In accordance with yet another aspect of the present invention, the transmission link may include an analog transmission link.

In accordance with still another aspect of the present invention, the transmission link may include a digital transmission link.

In accordance with another aspect of the present invention, the digital transmission link may include a digital modulating device for modulating the transmit signal with other signals for transmission over the transmission link and a digital demodulating device for removing the transmit signal from the other signals for post-processing of the transmit signal.

In accordance with yet another aspect of the present invention, the device for generating the second control signal may include a constant amplitude RF carrier generating device.

In accordance with another aspect of the present invention, the constant amplitude RF carrier generating device generates a constant amplitude modulated carrier.

In accordance with still another aspect of the present invention, the device for generating the second control signal may include a constant energy signal generating device.

In accordance with another aspect of the present invention, the second control signal may be a constant level unmodulated signal.

In accordance with a further aspect of the present invention the pre-processing unit further may include a time delay device for compensating for a transient transmit signal and for processing time in the first signal level adjusting means.

In accordance with yet another aspect of the present invention, the pre-processing unit may include a system data device for providing system data, including ancillary system control and supervision information. The system data may be carried by the control signal, and transmitted through the transmission link.

In accordance with a further aspect of the present invention, the post-processing unit may include a device for receiving the second control signal, and a device for determining an amplitude variation of the second control signal from a constant amplitude control signal. The second signal level adjusting device is adjusted according to the determined amplitude variation.

In accordance with another aspect of the present invention, the post-processing unit may include a plurality of digital tuners for concurrently processing the transmit signal and the control signal.

In accordance with still another aspect of the present invention, the digital tuners may include specified and programmable instantaneous center frequencies and bandwidths implemented in time domain representation using digital processing.

In accordance with another aspect of the present invention, the post-processing unit may include a plurality of digital tuners for concurrently processing a plurality of transmit signals and a plurality of second control signals.

In accordance with another aspect of the present invention, the post-processing unit may include a device responsive to the second control signal for adjusting the second signal level adjusting device.

In accordance with yet another aspect of the present invention, the post-processing unit may include a band pass filter for passing the transmit signal to the second signal level adjusting device.

In accordance with still another aspect of the present invention, the post-processing unit may include a time delay device for compensating for processing time in the second signal level adjusting device.

In accordance with still another aspect of the present invention, the post-processing unit may include a format converting device for converting the transmit signal from a digital signal to analog form.

In accordance with another aspect of the present invention, the second signal adjusting device may include a gain controlled amplifier, in which a gain of the gain controlled amplifier is adjusted according to the second control signal.

In accordance with another aspect of the present invention, the transmission link may include a diversity routing switch including a plurality of digital transmission links.

In accordance with yet another aspect of the present invention, the analog transmission link extends between a pair of modems. A first modem may be disposed between the pre-processing unit and the analog transmission link and a second modem may be disposed between the post-processing unit and the analog transmission link. The first modem converts digital signals from the pre-processing unit into analog form for transmission over the analog link and the second modem converts the transmitted analog signal into digital form for application to the post-processing unit.

In accordance with yet another aspect of the present invention, the digital transmission link may include an analog transmission link extending between a pair of modems. A first modem may be disposed between the pre-processing unit and the analog transmission link and a second modem may be disposed between the post-processing unit and the analog transmission link. The first modem converts digital signals from the pre-processing unit into analog form for transmission over the analog link and the second modem converts the transmitted analog signal into digital form for application to the post-processing unit.

Accordingly, an additional aspect of the present invention is directed to a dynamic range enhancing system for enhancing performance of a digital transmission link by controlling a transmit signal adapted to be transmitted over the digital transmission link within a communication path. The digital transmission link extends from a first location to a second location remote from the first location. The system may include a control device for detecting, at an initial position along the communication path, a level of the transmit signal, and for controlling first signal level adjusting device and second signal level adjusting device in response to the detected level. The first signal level adjusting device may include a device for adjusting the signal level of the transmit signal before transmission over the digital link, and the second signal level adjusting device may include a device for adjusting the level of the transmit signal after transmission over the digital link. The control device controls the first and second signal level adjusting devices to adjust the signal level of the transmit signal in a coordinated fashion based on the detected level. The first and second signal level adjusting devices respectively may include first and second outputs and devices for adjusting the level of the transmit signal present at the first and second outputs. The control device may include a device for controlling the first and second signal level adjusting devices so that the transmit signal level is decreased at the first output and increased at the second output when the detected transmit signal level increases, and the transmit signal level is increased at the first output and decreased at the second output when the detected transmit signal level decreases.

In accordance with another aspect of the present invention, the system may further include a pre-processing unit, for processing the transmit signal before transmission through the digital transmission link. The pre-processing unit may include the device and the first signal level adjusting means. The control device may further include a first output for providing a first control signal and a second output for providing a second control signal, the first control signal controls the first signal level adjusting device and said second control signal controls the second signal level adjusting device. The system may also include a post-processing unit, for processing the transmit signal after transmission through the digital transmission link, which may include the second signal level adjusting device.

In accordance with yet another aspect of the present invention, the control device may include a modulation device for modulating the second control signal.

In accordance with a further aspect of the present invention, the modulation device modulates according to at least one of amplitude modulation, amplitude shift keying, frequency modulation, frequency shift keying, phase modulation, phase shift keying.

In accordance with yet another aspect of the present invention, the system may further include a combining device, for combining the transmit signal and the second control signal. The transmit signal may be adjusted by the first signal adjusting device before the combining device combines the transmit signal and the control signal.

In accordance with a further aspect of the present invention, the system may further include a format converting device for converting an analog signal into digital form. The transmit signal is converted before being transmitted over the transmission link.

In accordance with a further aspect of the present invention, the first signal level adjusting device may include a gain controlled amplifier. A gain of the gain controlled amplifier may be adjusted according to the first control signal.

In accordance with still another aspect of the present invention, the digital transmission link may include a digital modulating device for modulating the transmit signal with other signals for transmission over the transmission link and a digital demodulating device for removing the transmit signal from the other signals for post-processing of the transmit signal.

In accordance with another aspect of the present invention, the pre-processing unit may further include a time delay device for compensating for processing time in the first signal level adjusting device.

In accordance with another aspect of the present invention, the pre-processing unit may include a system data device for providing system data, including ancillary system control and supervision information. The system data may be carried by the control signal, and may be transmitted through the transmission link.

In accordance with still another aspect of the present invention, the system may further include a plurality of pre-processing units for processing a plurality of transmit signals, a frequency converting device for converting a frequency of the transmit signal to be within a predetermined range, and a format converting device for converting an analog signal to a digital form for transmission over the transmission link.

In accordance with a further aspect of the present invention, the system may further include a combining device for combining each of the plurality of frequency converted transmit signals, such that a single signal is format converted before transmission over the transmission link.

In accordance with a further aspect of the present invention, the format converting device may include a plurality of format converting devices, such that each of the plurality of frequency converted transmit signals is individually format converted before transmission over the transmission link.

In accordance with still another aspect of the present invention, the post-processing unit may include a device for receiving the second control signal and a device responsive to the receive second control signal for adjusting the second signal level adjusting device.

In accordance with another aspect of the present invention, the device for receiving may include a signal demodulator.

In accordance with another aspect of the present invention, the post-processing unit may include a plurality of digital tuners for concurrently processing the transmit signal and the control signal.

In accordance with another aspect of the present invention, the digital tuners may include specified and programmable instantaneous center frequencies and bandwidths implemented in time domain representation using digital processing.

In accordance with yet another aspect of the present invention, the post-processing unit may include a plurality of digital tuners for concurrently processing a plurality of transmit signals and a plurality of second control signals.

In accordance with still another aspect of the present invention, the post-processing unit may include a device responsive to the second control signal for adjusting the second signal level adjusting device.

In accordance with a further aspect of the present invention, the post-processing unit may include a band pass filter for passing the transmit signal to the second signal level adjusting device.

In accordance with a further aspect of the present invention, the post-processing unit may include a time delay device for compensating for processing time in the second signal level adjusting device.

In accordance with another aspect of the present invention, the post-processing unit may include a format converting device for converting the transmit signal from a digital signal to analog form.

In accordance with another aspect of the present invention, the post-processing unit may further include a device for splitting an analog signal and filter means for passing predetermined portions of the split signal.

In accordance with another aspect of the present invention, the second signal adjusting device may include a gain controlled amplifier, in which a gain of the gain controlled amplifier is adjusting according to the second control signal.

In accordance with still another aspect of the present invention, the post-processing unit may include a plurality of format converting devices for converting a digital signal into analog form, and a plurality of post-processing units for processing each of the plurality of format converted signals.

In accordance with yet another aspect of the present invention, the post-processing unit may include a plurality of digital tuners for concurrently processing the combined transmit signals. The digital tuners may include specified and programmable instantaneous center frequencies and bandwidths implemented in time domain representation using digital processing.

In accordance with a further aspect of the present invention the post-processing unit may include a plurality of digital tuners for concurrently processing each individually format converted signal. The digital tuners may include specified and programmable instantaneous center frequencies and bandwidths implemented in time domain representation using digital processing.

BRIEF DESCRIPTION OF THE DRAWINGS

The above and other objects, features, and advantages of the present invention are further described in the detailed description which follows, with reference to the drawings by way of non-limiting examples of preferred embodiments of the present invention, wherein like reference numerals represent similar parts of the present invention throughout several views and wherein.

DETAILED DESCRIPTION OF THE PREFERRED EMBODIMENTS

Figure 1:
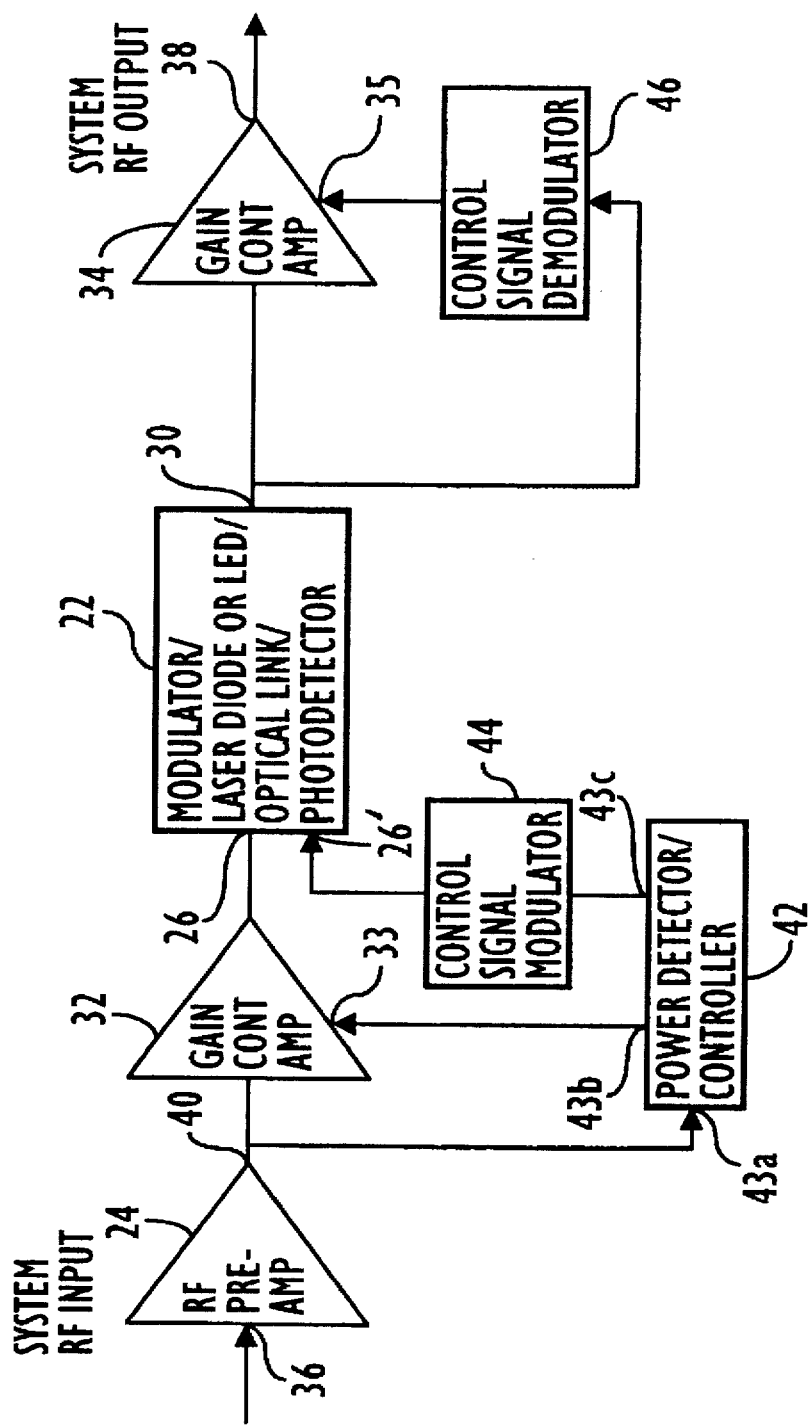
FIG. 1 is a block diagram of a dynamic range enhancing system from U.S. Pat. No. 5,321,849.
Figure 2:
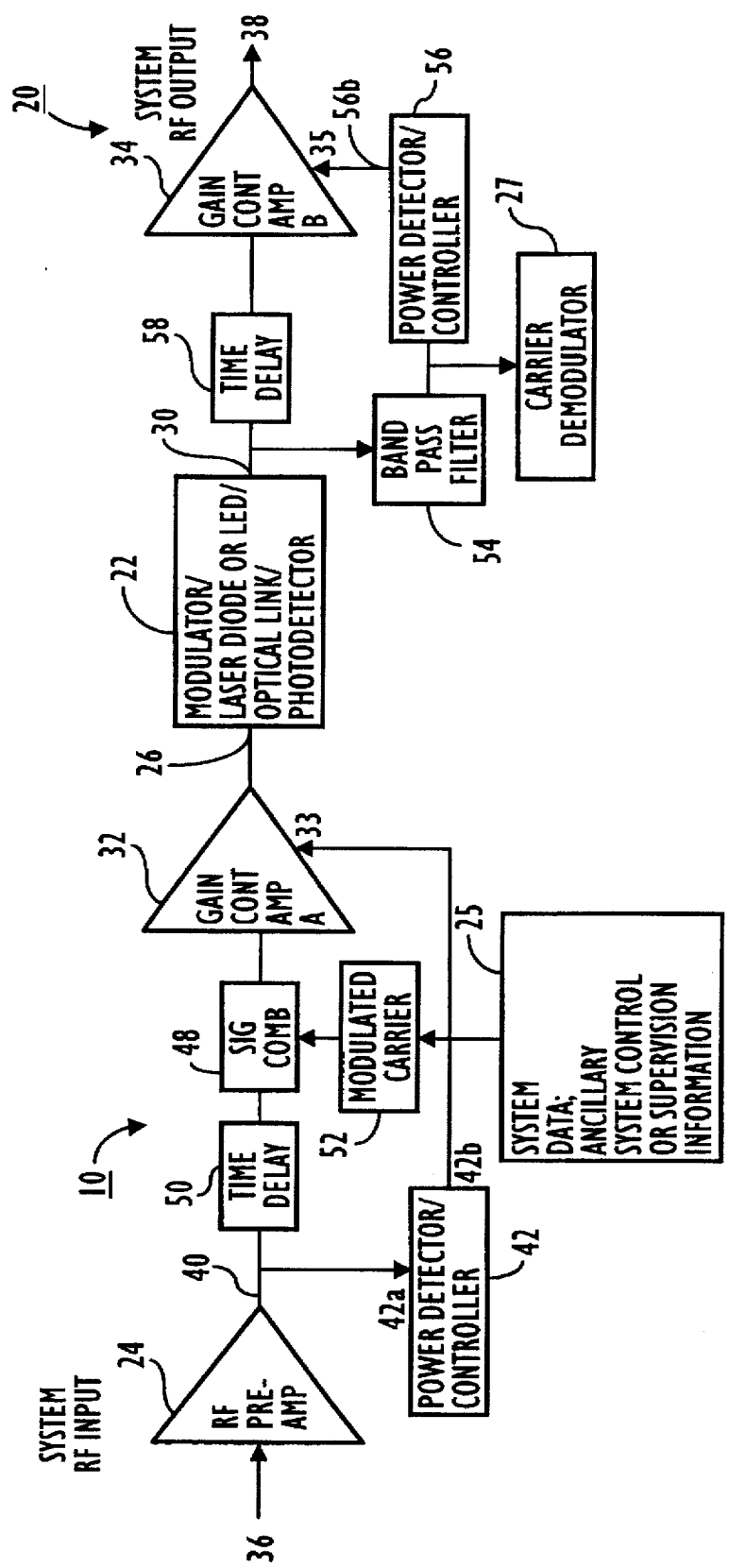
FIG. 2 is a block diagram illustrating an embodiment of a dynamic range enhancing system, according to the present invention, that is applied to an analog transmission link.

Referring now to the accompanying drawings in greater detail, a first embodiment of a dynamic range enhancing system of the present invention is illustrated in the general block diagram of FIG. 2.

An analog transmission link 22 is provided that comprises, e.g., an optical link including a modulator, a laser diode, or LED, and a photodetector, and which extends from a first end or input 26 to a remote end or output 30. The first end or input 26 of the analog transmission link 22 is connected to a pre-processing signal unit 10. The pre-processing signal unit 10 receives a RF or analog input signal 36 which is provided as input to an RF preamplifier 24. The output 40 of RF preamplifier 24 is coupled to an input 42a of a power detector/controller 42 and is also provided as input to an optional time delay network 50. An output 42b of power detector/controller 42 is connected to a programmable control input 33 of a gain control amplifier 32. A signal combiner 48 is provided that is coupled to receive a delayed input signal from time delay network 50 and a control signal from a modulated carrier device 52. Gain control amplifier 32 has an input coupled to the output of signal combiner 48 and an output for coupling the pre-processing signal unit 10 to first end 26 of analog transmission link 22.

Modulated carrier 52 may be optionally coupled to receive system data, such as ancillary system control and supervision information, from a system data device 25. System data device 25 may include a memory storage device (not shown) for storing and outputting ancillary system control and supervision information. Such a memory device may be implemented by computer storage disks, random access memory (RAM) modules, or any functionally equivalent storage device or combination of devices with sufficient memory capacity and accessing facilities.

At remote end or output 30 of analog transmission link 22, a signal post-processing unit 20 is provided. Signal post-processing unit 20 includes an optional time delay network 58 and a bandpass filter 54. Remote end 30 of link 22 is coupled to an input of time delay network 58 and to an input of bandpass filter 54. A power detector controller 56 and an optional carrier demodulator 27 are also provided that have inputs which are coupled to an output of bandpass filter 54. As shown in FIG. 2, a gain control amplifier 34 may also be provided that has an input coupled to an output of time delay 58 and provides at its output the system RF or analog output signal 38. A programmable control input 35 of gain control amplifier 34 is connected to an output 56b of power detector/ controller 56.

A description of the signal processing and operation of a dynamic range enhancing system of the present invention will now be provided with reference to FIG. 2.

System RF or analog input signal 36 enters the signal pre-processing unit 10 by passing through RF preamplifier 24. Power detector/controller 42 receives, at input 42a, the amplified signal present at output 40 to determine the instantaneous power level of the system input signal 36. Thereafter, power detector/controller output 42b provides a first control signal to programmable control input 33 of gain control amplifier 32 to adjust the gain in accordance with the detected level. The amplified signal from RF preamplifier 42 may also by processed by time delay network 50, for synchronization and outputting a delayed system input signal. This synchronization of the input signals prevents high amplitude signals from being transmitted over link 22.

As further shown in FIG. 2, modulated carrier 52 provides a second control signal (e.g., a constant amplitude control signal or a constant energy control signal), to be combined with the delayed system input signal by signal combiner 48. The combined system input and second control signal is then amplified by gain control amplifier 32, which can be of any conventional design, e.g., manufactured by California Eastern Laboratories, and/or any other functional equivalent design or implementation, by an amount corresponding to the gain value set by power detector/controller 42. This process affects the level of the RF or analog input signals, as well as the control signal. The pre-processed signal is then converted into an optical intensity-modulated signal and subsequently transmitted over transmission link 22. Link 22 may comprise an optical fiber cable link, a free-space optical link, or any other type of analog transmission link.

Optionally, the user may desire to transmit system data, e.g., ancillary system control or supervision information, with the combined system signal through the transmission link 22. To transmit such information, the system data may be provided as input to modulated carrier 52 from system data device 25, for combination with the system input signal in signal combiner 48. If such system data is included, the modulation process of the system must not significantly affect the instantaneous amplitude of the control signal applied to the signal combiner 48. The amplitude of the second control signal must remain substantially constant at the point where it enters signal combiner 48. Therefore, a modulation (e.g., FM/FSK or PM/PSK modulation) that does not significantly affect the signal amplitude of the control signal outputted from modulated carrier 52 should be employed.

When the combined system input and second control signal are transmitted through analog transmission link 22 and arrive at remote end 30, the signal is split with one portion entering bandpass filter 54 and the remaining portion being processed by time delay network 58 and entering gain control amplifier 32. The bandpass filter 54 isolates and outputs only the second control signal. The time delay network 58 may be used to synchronize, when necessary, the processing of the signals in post-processing unit 20 so that minimal overall RF or analog signal distortion results.

The second control signal, isolated by bandpass filter 54, is provided as input to power detector/controller 56. Power detector/controller 56 will then measure the instantaneous power level of the control signal, and provide a gain control signal to programmable control input 35 of gain control amplifier 34. Because the second control signal is of a known amplitude, power detector/controller 56 determines the pre-processing unit gain setting for gain control amplifier 32 by determining the amplitude variation of the transmitted second control signal. Once the gain setting for gain control amplifier 32 is known, power detector/controller 56 will adjust programmable control input 35 to a gain setting amount equal and opposite to the gain adjustment of gain control amplifier 32.

Accordingly, the post-processing unit 20 for this embodiment detects an instantaneous power level and a variation in the control signal transmitted to remote end 30, and adjusts the gain setting of gain control amplifier 34 to compensate for the detected variation.

If system data (e.g., ancillary system control or supervision information) from system data device 25 is transmitted through transmission link 22, a carrier demodulator 27 must also be included within the post-processing unit 20. As illustrated in FIG. 2, a carrier demodulator 27 may be provided which receives the transmitted control signal isolated by bandpass filter 54. Carrier demodulator 27 demodulates and recovers the system data modulated onto the control signal in the pre-processing unit 10.

In accordance with an aspect of the present invention, power detector/controller 42 may determine the instantaneous power level of the system input signal (provided at output 40) and adjust the gain of gain control amplifier 32 in the following manner. If the detected instantaneous power level of the system signal at output 40 is below a first predetermined threshold value, the power detector/controller 42 generates a signal to programmable control input 33 to set the gain of gain control amplifier 32 to a maximum value. The combined system input signal and control signal will be amplified by the maximum gain value of gain control amplifier 32, and the amplified control signal will ultimately be isolated and provided to power detector/controller 56 so that the gain applied to the control signal in the pre-processing unit 10 may be determined. When power detector/controller 56 determines that gain control amplifier 32 has been set to a maximum gain value, a gain control signal will be issued to programmable input 35 to set the gain of gain control amplifier 34 to a minimum value to offset the gain adjustment in unit 10.

If the detected instantaneous power level of the system signal at output 40 increases slightly, the gain settings for gain control amplifiers 32 and 34 will remain fixed. However, if the detected instantaneous power level of the system signal at output 40 rise to a level above the first predetermined threshold, power detector/controller 42 will output a gain control signal to programmable control input 33 to decrease the gain value of gain control amplifier 32 from the given maximum value. The amount of decrease in the gain value may depend upon the amount of increase in the system RF or analog input signal power level. That is, for every one dB increase in system RF or analog input signal power level at output 40 above the first predetermined threshold, the gain of gain control amplifier 32 is decreased one dB from the given maximum value.

Conversely, since power detector/controller 56 will be detecting a lower gain varied control signal, the detected amplitude (or energy) variation from the known constant amplitude due to the gain setting of gain control amplifier 32 is used by the power detector/controller 56 to output a gain control signal to programmable control input 35 to increase the gain value of gain control amplifier 34. The gain value is adjusted by an amount corresponding to the gain value set in gain control amplifier 32.

If the detected instantaneous power level of the system signal at output 40 continues to rise to a level above a second predetermined threshold, e.g., a point at which the gain control amplifier 34 has been set to a maximum gain value, power detector/controller 42 may optionally be programmed to continue issuing signals to programmable control input 33 of gain control amplifier 32 to continue decreasing the gain amount by one dB for each additional one dB increase in system signal power level, even though the post-processing unit 20 will no longer adjust gain control amplifier 34. In this mode, power detector/controller 42 continues compensating for the increasing system signal input power until gain control amplifier 32 reaches a minimum value setting, resulting in both gain control amplifiers 32 and 34 being set to constant levels. The point at which gain control amplifier 32 reaches a minimum value setting is when the system RF or analog input signal power level reaches a third predetermined threshold.

The specific threshold levels employed by the power detector/controller 42 are application specific, and therefore, depend upon the type of transmission link and the specifics of the gain control amplifier. Those ordinarily skilled in the art will define actual threshold values by considering the characteristics of both the transmission link and the gain control amplifier and selecting an appropriate threshold which ensures that the signal input to the transmission link remains within the appropriate range.

Thus, when the detected system input signal power level is below a first threshold, both gain control amplifiers 32 and 34 are set to a constant gain level. When the input power level is between the first threshold and a second threshold, gain control amplifier 32 is set to decrease the relative power level of the transmit signal present at input 26 of transmission link 22, and gain control amplifier 34 will increase in an equal amount in response thereto. When the input power level is between the second threshold and the third threshold, only gain control amplifier 32 is active (i.e., only the gain of amplifier 32 is varied to compensate for changes in the input signal level). When the input power level is above the third threshold, neither gain control amplifier 32 nor gain control amplifier 34 is active (i.e., both amplifiers 32 and 34 are maintained at constant gain levels).

As discussed above, time delay network 50 and time delay network 58 are optional elements in the embodiment of FIG. 2. The time delay networks may be employed for applications requiring a demanding degree of transient response and/or response speed. The time delay networks 50 and 58 compensate for a time lag created by processing the system RF or analog input signal in power detector/controller 42, and by processing time to coordinate the transmitted and control signal in power detector/controller 56, respectively. Time delay networks 50 and 58 may comprise, e.g., conventional time delay circuits, and may be utilized to achieve beneficial results, depending upon the particular application and use of the system, and the desired results of the same.

The above described embodiment of FIG. 2 relates to an aspect of the invention for increasing the dynamic range of an analog transmission link, by lowering input distortion due to intermodulation noise. However, as noted earlier, in certain applications an analog transmission link may not be desirable. For example, when a signal is transmitted over a long distance through an analog transmission link, signal quality tends to deteriorate as the distance increases. Therefore, in applications in which data is to be transmitted over great distances, a more reliable transmission link is preferred which does not degrade a signal quality over distance, e.g., a digital transmission link. While digital transmission links have considerable advantages, including not being susceptible to the same problems associated with dynamic range as are analog transmission links, when a digital transmission link employs an analog-to-digital (A/D) converter and a digital-to-analog (D/A) converter, the signal must be adjusted or centered to fit within the given input range of the analog-to-digital and the digital-to-analog converters.

In accordance with a second embodiment of the present invention, as described hereinafter with reference to FIG. 3, a dynamic range enhancing system may be applied to a digital transmission link system with a communication path comprising an analog-to-digital converter, a digital transmission link, and a digital-to-analog converter.

Figure 3:
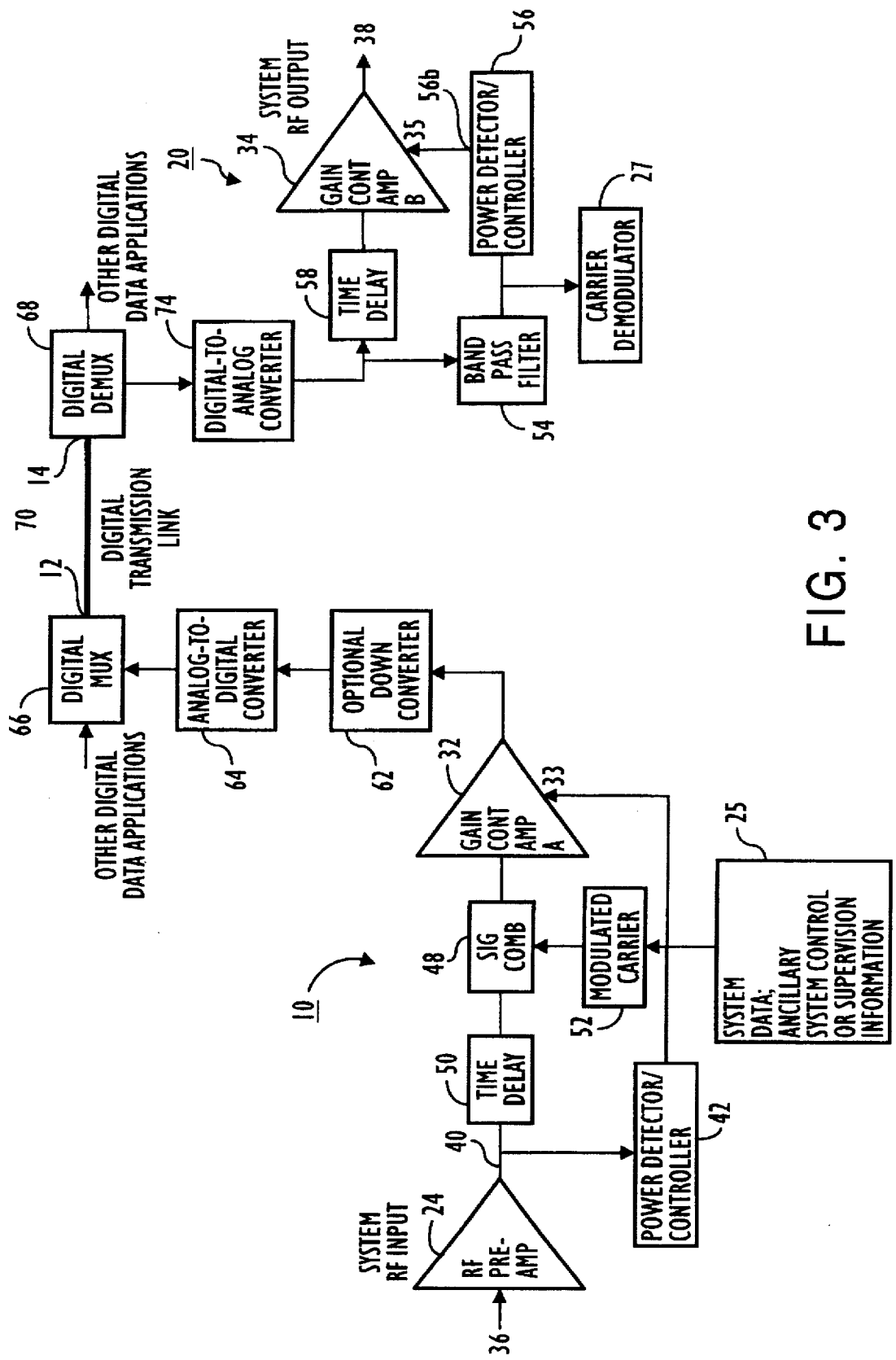
FIG. 3 is a block diagram illustrating a second embodiment of a dynamic range enhancing system of the present invention that is applied to a digital transmission link.

The signal pre-processing unit 10 of FIG. 3 includes similar elements to that of the signal pre-processing unit 10 described above with reference to FIG. 2; thus, a detailed description of these elements is not repeated herein. However, in this embodiment, an optional down converter 62 is provided that is coupled to the output of gain control amplifier 32 and connected to the input of an analog-to-digital converter 64. As shown in FIG. 3, a digital multiplexer 66 is also provided that is connected to the output of analog-to-digital converter 64 and coupled to a first end or input 12 of digital transmission link 70.

The signal post-processing unit 20 of FIG. 3 also includes elements similar to that in the signal post-processing unit 20 described above with reference to FIG. 2; reference is made to the above description of these similar elements for an understanding of their operation. However, in the embodiment of FIG. 3, a digital demultiplexer 68 is included that is connected to a remote end or output 14 of digital transmission link 70, and that is connected to an input of a digital-to-analog converter 74. The output of digital-to-analog converter 74 is coupled to the input of time delay network 58 and to the input of bandpass filter 54 of signal post-processing unit 20.

The operation of FIG. 3 proceeds in much the same manner as the first embodiment, described above with reference to FIG. 2. The system RF or analog input signal 36 is applied to RF preamplifier 24 where it is amplified before it is provided at output 40. The amplified signal at output 40 of RF preamplifier 24 is then split to provide a portion of the signal to power detector/controller 42 and a remaining portion of the signal to the optional time delay network 50. Power detector/controller 42 detects the instantaneous power level of the system signal at output 40 and generates a gain control signal to programmable control input 33 of gain control amplifier 32, to adjust the gain of amplifier 32 in accordance with the detected level of the system signal.

However, in this case, the first predetermined threshold level is selected such that if the system RF or analog input signal level does not surpass the first predetermined threshold, the system input signal will be amplified or boosted to ensure that the signal will be within the range appropriate for analog-to-digital converter 64. That is, analog-to-digital converter 64 has an input range that requires a minimum level of signal strength to format convert the signal. Power detector/controller 42 detects the system input signal level to determine if the level satisfies the requirements of analog-to-digital converter 64 based on the first predetermined threshold. If the input signal level is too low, gain control amplifier 32 is adjusted in accordance with a gain control signal provided at programmable control input 33 to set the gain value to a maximum value in order to amplify the input signal to a level above the first predetermined threshold level. The remaining operation, use of preset threshold levels, and adjustment of the gain control amplifiers in the embodiment of FIG. 3 are otherwise identical to that previously described with reference to FIG. 2.

As noted above, time delay 50 may be optionally employed to compensate for time lag that may be created due to processing transient spikes in the input signal by power detector/controller 42. The time delayed system signal and a constant amplitude second control signal from modulated carrier 52, optionally containing additional system data from device 25 relating to ancillary system control or supervision information, are combined in signal combiner 48 before being amplified by gain control amplifier 32. The amount of amplification is based on the gain set at programmable control input 33 by power detector/controller 42.

A pre-processed signal is output from gain control amplifier 32 and applied to optional down converter 62. Optional down converter 62 performs a frequency conversion operation on the pre-processed signal to convert the pre-processed signal to a sufficiently low frequency to enable format conversion by the analog-to-digital converter 64. Analog-to-digital converter 64 converts the RF or analog pre-processed signal from optional down converter 62 into a time division multiplexed (TDM) serial bit stream. The bit stream is then applied to an input of digital multiplexer 66, where it may be combined with other digital signals to be transmitted over digital transmission link 70. These other digital signals may include other digital signals transmitted simultaneously through a single link, for example, pre-processing unit may comprise part of a cellular telephone base station or cell site in which several calls are simultaneously transmitted though the link to a cell switch or other remote location.

At the remote end or output 14 of digital transmission link 70, digital demultiplexer 68 strips off (i.e., removes) any of the other digital signals added by digital multiplexer 66, and sends the transmitted bit stream containing the format-converted RF or analog input signal and the control signal to digital-to-analog converter 74. The signals are then converted by digital-to-analog converter 74, with the resulting RF or analog baseband signal being split at the output of converter 74, so that a portion of the signal is provided as input to bandpass filter 54 and the remaining portion of the signal is provided to optional time delay network 58. Time delay network 58 time delays the converted signal in order to synchronize processing of the signals along the communication path and minimize the overall RF or analog signal distortion. As shown in FIG. 3, the time delayed signal is outputted from time delay network 58 and provided to the input of gain control amplifier 34, the operation of which is discussed more fully below.

Bandpass filter 54 isolates and passes only the second control signal (and any system data contained therein), which is provided as input to carrier demodulator 27 and power detector/controller 56. Carrier demodulator 27 receives the second control signal passed by bandpass filter 54 to recover any of the system data, e.g., ancillary system control or supervision information, contained therein. Power detector/controller 56 also receives the signal passed by bandpass filter 54. Power detector/controller 56 detects the instantaneous power level of the constant amplitude or energy second control signal generated by modulated carrier device 52, to determine the variation of the signal amplitude or energy due to the gain setting of the gain control amplifier 32 of pre-processing unit 10. Based on this determination, power controller 56 generates a gain control signal that is provided as input to programmable control input 35 of gain control amplifier 34. In accordance with the gain control signal, the gain setting of amplifier 34 is adjusted to compensate for the amplification of the transmitted signal in the pre-processing unit 10. The time delayed converted input signal is then adjusted by gain control amplifier 34 such that the post-processed system RF or analog output signal 38 is substantially the same as the system RF or analog input signal 36. Accordingly, the system maintains a constant overall gain (or loss) that is independent of the input signal level.

A significant advantage of the second embodiment of the present invention is the simple/reliable synchronization of the adjusted input signal and the control signal. As discussed above, past approaches required digitizing the control signal and transmitting it over a separate transmission link, or digitally multiplexing the control signal to be sent through the same digital transmission link as the input signal, but at a different rate. Certain delays were inherent in these past approaches, requiring employment of synchronizing means, e.g., time delays, and reference timing signals to ensure synchronization. Because the second embodiment of the present invention combines the input signal and the control signal prior to format converting the combined signal for transmission signal over the digital transmission link, the second embodiment avoids any necessity of reference timing signals or equalizing the analog-to-digital converter and the digital-to-analog converter time delays.

Another significant advantage of this embodiment of the invention is the reduction of the digital transmission rate required for a given level of overall system performance. The present invention reduces the number of digital bits per signal sample required to be transmitted over the transmission link, assuming a required RF input signal amplitude range. This reduction in bits per sample lowers the overall complexity of the signal processing functionality required at the ends of the transmission link. This reduction also reduces the operational cost of the system, especially if costs are incurred on a bit per second basis. For example, if an analog-to-digital converter required fourteen bits to digitize a signal of appropriate bandwidth, and the converter sampled at a rate of 10 MHz, the transmission rate of the digitized signal over the link would be 140 Mbits/second. However, if the analog-to-digital converter only required ten bits to digitize a signal at a same bandwidth, and sampled at the 10 MHz rate, the transmission rate over the link would be reduced to 100 Mbits/second. The control signal can be employed to have a low control signal data rate, e.g., 100 kHz, thus, to transmit the signal and the control signal together requires a transmission rate of 100.1 Mbits/second, well below the 140 Mbits/second rate required in the first analog-to-digital converter. Because the signals in the present invention are combined prior to digitizing, only a single signal is transmitted, and the aggregate signal transmission is also well below the 140 Mbits/second rate.

To enhance the dynamic range of an analog-to-digital converter, it is necessary for the user to know certain converter parameters and specifications, e.g., the resolution of conversion, the number of bits of resolution, the number of samples-per-second for conversion, spurious free dynamic range, etc. It is also necessary to know the acceptable frequency band for signals to be format converted and the minimum and maximum amplitude for an input signal.

A third embodiment of the present invention will now be described below with reference to FIG. 4.

Figure 4:
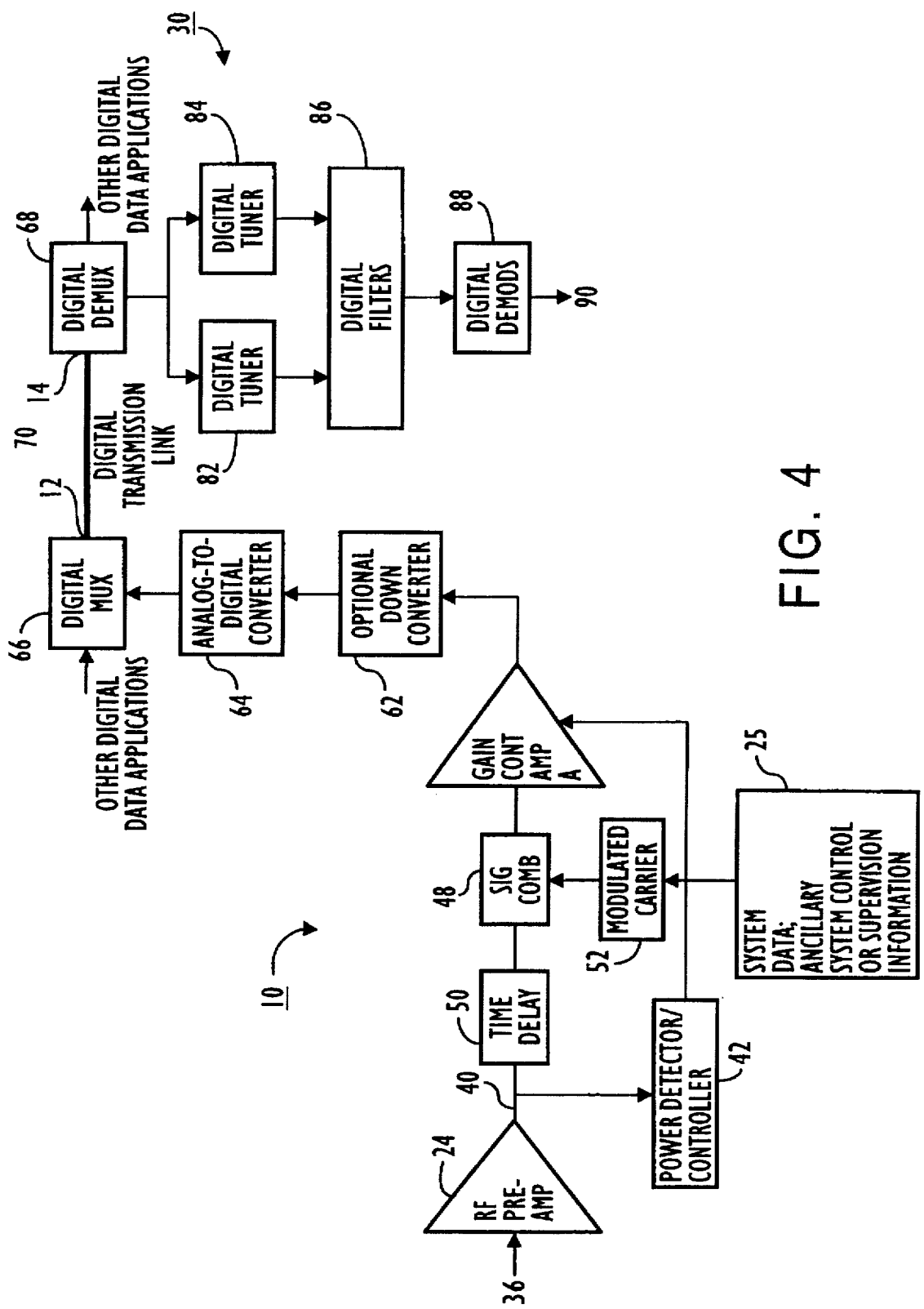
FIG. 4 is a block diagram illustrating a third embodiment of a dynamic range enhancing system according to the invention, wherein digital tuners and digital filters are employed.

The embodiment illustrated in FIG. 4 includes a configuration that is similar to that described above with reference to FIG. 3, except that a post-processing unit is provided which outputs a digital signal representation of the system RF or analog input signal. As shown in FIG. 4, a post-processing unit 30 is provided that includes a digital demultiplexer 68 which feeds digital tuners 82 and 84. In the embodiment illustrated in FIG. 4, digital demultiplexer 68 is shown as providing output to two digital tuners 82 and 84; however, the invention is not limited to such an arrangement and two or more digital tuners may be provided. Digital tuner 82 and digital tuner 84 are connected at their inputs to the output of digital demultiplexer 68. The outputs of a digital tuner 82 and 84 are connected to a bank of digital filters 86. A digital demodulator 88, coupled to the bank of digital filters 86, is also provided for outputting a digital signal 90.

In operation, the pre-processing unit 10 and transmission of the pre-processed signal through digital transmission link 70, as shown in FIG. 4, is similar to that described above with reference to FIG. 3. However, in the embodiment of FIG. 4, digital demultiplexer 68 outputs a demultiplexed digital signal to two or more digital tuners (i.e., digital tuners 82 and 84). Digital tuner 82 may be provided to isolate and remove the digitized transmit signal from the digitized control signal, and pass only the digitized control signal to digital filter bank 86. Further, digital tuner 84 may be provided for removing the digitized control signal from the digitized transmit signal, and passing only the digitized transmit signal to digital filter bank 86. The bank of digital filters 86 receives the digitized transmit and control signals, and outputs a digital representation of the system RF or analog input signal 36. The digital representation of the system RF or analog input signal 36 is applied to a bank of digital demodulators 88 for further processing of the signal to provide a digital output signal 90. The processing performed by demodulator 88 may include converting the digital signals to a compatible or other suitable format for end-use devices, as discussed more fully below.

The digital tuners and digital filter bank employed in the present invention may be of conventional design, e.g., such as that manufactured by Steinbrecher Corp. under the name "MiniCell," or Watkins and Johnson Company, and/or any functionally equivalent design. Further digital tuners 82 and 84 are designed so that each tuner has the equivalent of a specified and software-programmable instantaneous center frequency and bandwidth, that is implemented in a time domain representation using digital signal processing. Also, the bank of digital filters 86 may employ an algorithm substantially similar to the algorithm described in U.S. Pat. No. 5,321,849, except the algorithm processes a digitally formatted signal. That is, the correct representation of each signal is a function in the time domain of the digitized transmit signal and the digitized control signal.

As noted above, the processing performed by demodulator 88 may include converting the digital signals to a compatible or other suitable format. For example, the bank of digital demodulators 88 may convert the signal from the bank of digital filters 86 into formats that are compatible with a variety of end-use devices, including: cellular or wire telephone switches (e.g., a 64 kbps representation of a voice signal known as DSO); analog or digital switches; network interface with a called party; and a device for selecting and passing on the best quality transmitted signal received over several antennas.

Figure 5:
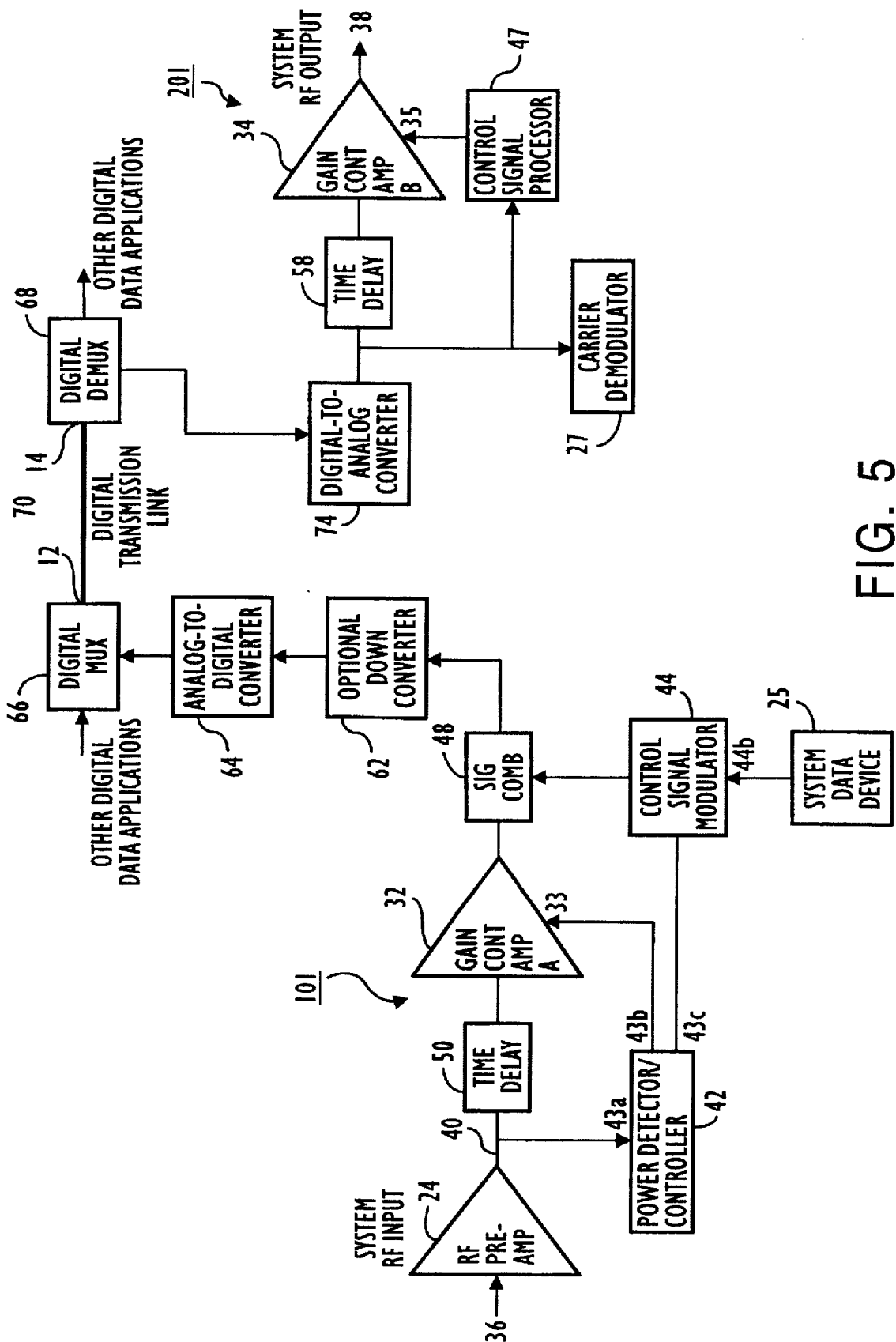
FIG. 5 is a block diagram illustrating a fourth embodiment of a dynamic range enhancing system of the present invention, wherein a control signal is encoded with information to directly control the post-processing unit.

Referring now to FIG. 5, a fourth embodiment of the present invention will be described, wherein a control signal encoded with information to directly control the post-processing unit is employed to enhance the dynamic range of the digital transmission link system. The dynamic range enhancing system shown in FIG. 5 comprises a pre-processing unit 101, a digital transmission link 70, and a post-processing unit 201.

Pre-processing unit 101 may include a power detector/controller 42 and a control signal modulator 44, similar to that described in U.S. Pat. No. 5,321,849. A system RF or analog input signal 36 is applied to the input of RF preamplifier 24. The output 40 of the RF preamplifier 24 is connected to a gain control amplifier 32 via an optional time delay network 50, and to a power detector/controller 43 at an input 43a. A first output 43b of power detector/controller 43 is connected to a programming control input 33 of gain control amplifier 32. Control signal modulator 44 is connected at a first input 44a to a second output 43c of power detector/controller 43 and provides output to signal combiner 48. A second input 44b of control signal modulator 44 may be coupled to system data device 25 for providing system data e.g., ancillary system control and supervision information. The output of gain control amplifier 32 is coupled to signal combiner 48. The output of signal combiner 48 may be coupled to an optional down converter 62. An analog-to-digital converter 64 receives the output of optional down converter 62 and is coupled to digital multiplexer 66 at the first end or input 12 of digital transmission link 70.

As illustrated in FIG. 5, digital demultiplexer 68 is connected to digital transmission link 70 at remote end or output 14 and is connected to an input of digital-to-analog converter 74. The output of digital-to-analog converter 74 is coupled to control signal processor 47 and to optional time delay network 58 of signal post-processing unit 201, and may be coupled to optional carrier demodulator 27. Gain control amplifier 34 includes an input that is connected to optional time delay 58 and outputs the system RF or analog output signal 38. Control signal processor 47 is coupled to programmable control input 35 of gain control amplifier 34.

The basic operation of the fourth embodiment of the present invention will now be described. Initially, a system RF or analog input signal 36 is provided as input to the pre-processing unit 101 via RF preamplifier 24. The amplified signal present at output 40 of RF preamplifier 24 is outputted to power detector/controller 42, which detects the instantaneous power level of the signal. In this embodiment of the present invention, power detector/controller 43 is provided for issuing a pair of control signals. A first control signal is issued via output 43b to the programmable control input 33 of gain control amplifier 32 to adjust the gain setting of the amplifier in response to the detected instantaneous power level. A second control signal is issued via output 43c to control the setting of gain control amplifier 34 in post-processing unit 201.

The second control signal from power detector/controller 43 is applied to the control signal modulator 44 (prior to transmission) to produce an RF carrier modulated by the second control signal. The RF carrier modulated signal may optionally contain additional system data from system data device 25 relating to, e.g., ancillary system control or supervision information. The amplified time delayed system signal generated by time delay network 50 and gain control amplifier 32 is combined with the modulated second control signal in signal combiner 48 to produce the pre-processed signal applied to optional down converter 62. Optional down converter 62 performs a frequency conversion of the pre-processed signal to convert the pre-processed signal to a frequency that is low enough to enable format conversion in the analog-to-digital converter 64. Analog-to-digital converter 64 converts the RF or analog pre-processed signal from optional down converter 62 into a time division multiplexed (TDM) serial bit stream. The bit stream is then applied to an input of digital multiplexer 66, where it may be combined with other digital signals to be transmitted over a single digital transmission link 70.

At the remote end 14 of digital transmission link 70, digital demultiplexer 68 strips off (i.e., removes) any of the other digital signals added by digital multiplexer 66 and sends the transmitted bit stream, containing the format converted RF analog signal and control signal, for conversion by digital-to-analog converter 74. The resulting signal is provided at the output of analog-to-digital converter 74, with a portion of the signal entering control signal processor 47, and the remaining portion of the converted signal being time delayed through optional time delay network 58. The carrier demodulator 27 may optionally be employed to also receive the output of the digital-to-analog converter so as to retrieve the data system information from data system device 25. This time delay may be provided to synchronize processing of the signals along the communication path and to minimize overall RF or analog signal distortion. However, no time delay is needed to equalize the analog-to-digital converter and the digital-to-analog converter delays, since the control signal is processed concurrently with the composite RF or analog signal.

Based on the output of digital-to-analog converter 74, control signal processor 47 isolates the modulated control signal issued from output 43c of power detector/controller 43 and demodulates the control signal in order to provide the signal as output to programmable input 35 of gain control amplifier 34. Control signal processor 47 adjusts the gain setting of gain control amplifier 34 according to the detected control signal sent via output 43c to compensate for the pre-processing amplification of the transmitted signal. The delayed transmit signal generated by time delay network 58 is then adjusted by gain control amplifier 34, such that the post-processed system RF or analog output signal 38 is substantially the same as the system RF or analog input signal 36. As a result, the embodiment of FIG. 5 maintains a constant overall gain (or loss) that is independent of the input signal level.

Because the fourth embodiment of the present invention issues two control signals, there is a reduction in the sophistication of a portion of the equipment needed to achieve the desired results. That is, power detector/controller 43 issues a first control signal from output 43b to directly control gain control amplifier 32, and issues a second control signal from output 43c to directly control gain control amplifier 34. As discussed above, control signal processor 47 is provided simply to receive and demodulate the second control signal and to pass the same on to programmable control input 35. As a result, a more simplified operation than that performed by power detector controller 56 in the second embodiment may be utilized. In the second embodiment of FIG. 3, power detector/controller 56 was required to (i) receive the control signal, (ii) determine the amplitude variation due to the pre-processing gain, (iii) determine an amount to adjust gain control amplifier 34 to compensate for the pre-processing gain, and (iv) issue the setting signal to programmable control input 35. The second embodiment of the invention thus requires two processors (i.e., controllers 42 and 56) for issuing control commands to two amplifiers, whereas in the fourth embodiment, a single control signal generator (i.e., controller 43) is providing for issuing essentially equal (but opposite) control commands to the two amplifiers.

In the embodiment illustrated in FIG. 5, when the input power level is below a first predetermined threshold level, power detector/controller 43 issues control signals to gain control amplifiers 32 and 34, to set a constant maximum and minimum gain value, respectively. When the input power level is between the first predetermined threshold level and a second predetermined threshold level, power detector/ controller 43 issues two control signals that are essentially equal and opposite. The first control signal decreases the gain of gain control amplifier 32, and the second control signal increases the gain of gain control amplifier 34, with the relative power levels of the transmitted signals being varied based on the same one dB to one dB basis. When the input power level is between the second predetermined threshold level and a third predetermined threshold level, however, only the first control signal is generated to adjust gain control amplifier 32. The second control signal, on the other hand, is constant and will hold the gain of gain control amplifier 34 at a fixed maximum value. When power detector/controller detects an input power level above the third predetermined threshold, the issued control signals are constant and will hold the respective gains of gain control amplifiers 32 and 34 at a fixed minimum value and a fixed maximum value, respectively.

The embodiment of FIG. 5 has several advantages over the previous embodiments described above. For example, in the first three embodiments of the present invention, a constant amplitude (or constant energy) modulated carrier is employed as the second control signal. Thus, those embodiments are constrained in that various amplitude modulation techniques cannot be employed. The fourth embodiment, however, is not limited in this regard. The modulation type may be FM (frequency modulation), FSK (frequency-shift-keying), PM (phase modulation), PSK (phase-shift-keying), AM (amplitude modulation), ASK (amplitude shift keying), or any combination of these, as may be implemented by one of ordinary skill in the art and as the particular application may dictate.

Another advantage of the fourth embodiment of the present invention is that the appropriate center frequency of the control signal may either be within the frequency band of the system RF or analog input signals or, alternatively, at the band edge. If a particular application, for example, does not use information transmitted at the mid-band frequency, the present embodiment can employ the mid-band frequency as the control signal frequency. Likewise, if the particular application does not contain information transmitted at a band edge frequency, the present embodiment can employ the band edge frequency as the control signal frequency. As such, this embodiment offers greater flexibility and overall cost reduction for the system, in that it is not necessary to employ a format conversion device with a bandwidth much larger than the bandwidth expected from the input signals to accommodate the control signal. For example, if the expected frequency range for the RF or analog input signals has an expected frequency bandwidth of 10 MHz, and the control signal employed has a frequency outside of the 10 MHz bandwidth, then normally the bandwidth of the analog-to-digital converter would be required to have an input bandwidth equal to the expected RF or analog input signals, as well as a bandwidth that encompasses the frequency of the control signal.

As with the second embodiment of the present invention, a significant advantage of the embodiment of FIG. 5 is the simple and reliable synchronization of the adjusted system input signal and the control signal. The fourth embodiment of the present invention combines the amplified time delayed signal and the modulated control signal prior to format conversion. Thus, a single digitized signal, containing the converted RF or analog input signal and the control signal, is transmitted over the digital transmission link and any errors due to asynchronous transmission of signals or mistiming are avoided.

A fifth embodiment of the present invention, shown in FIG. 6, will now be described in detail below.

Figure 6:
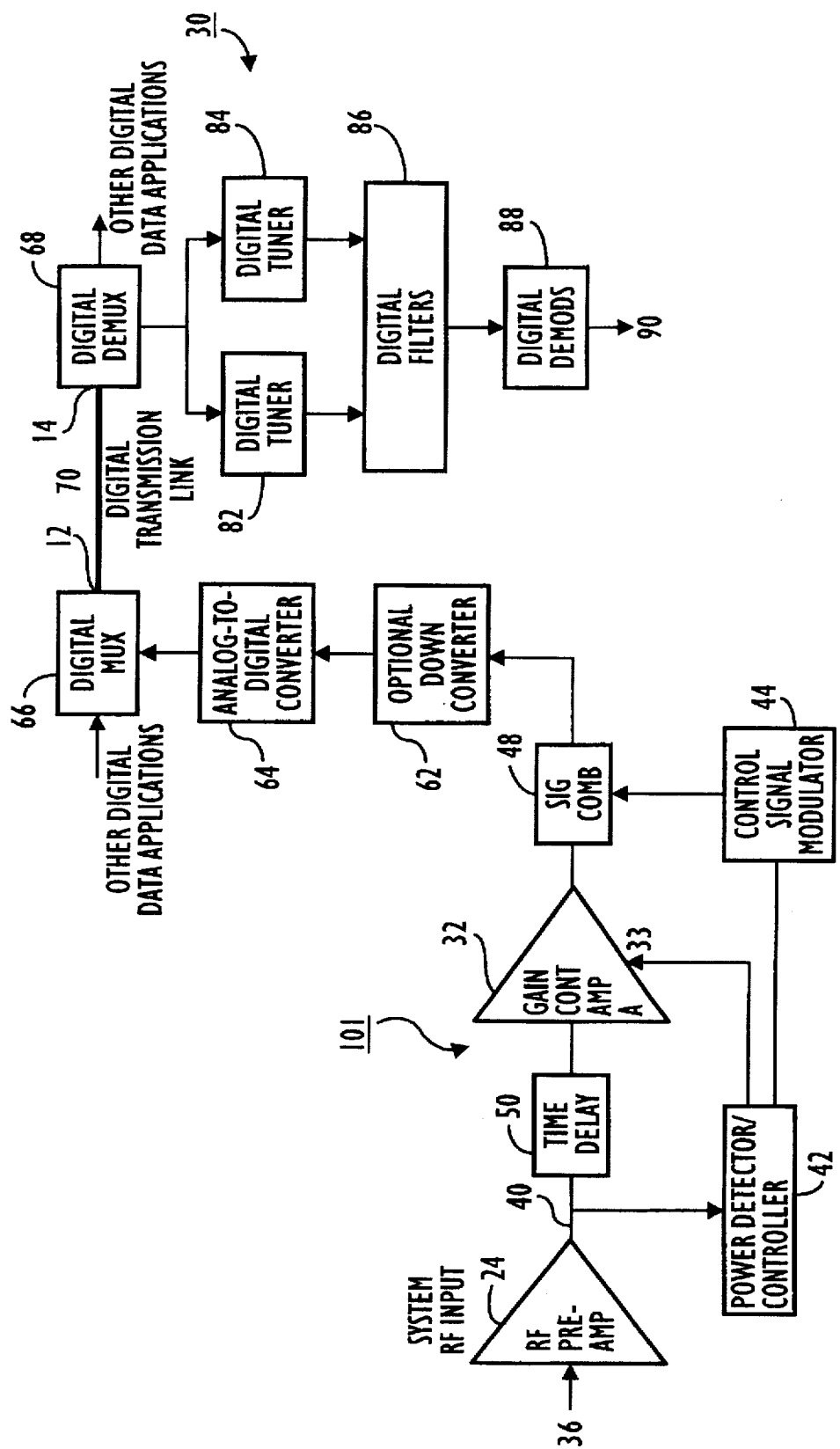
FIG. 6 is a block diagram illustrating a fifth embodiment of a dynamic range enhancing system of the invention, wherein a control signal is encoded with information to directly control the post-processing unit, and digital tuners and digital filters are employed.

In FIG. 6, a pre-processing configuration is provided that is similar to that described above with reference to FIG. 5, the pre-processing configuration is coupled to a post-processing unit 30 (substantially identical to that shown in FIG. 4) that has been provided to output a digital output signal representation of the system RF or analog input signal. Post-processing unit 30 includes two or more digital tuners that are connected to an output of digital demultiplexer 68. In the illustration of FIG. 6, two digital tuners 82 and 84 are provided (although more than two digital turners may be provided) that have inputs that are connected to the split signal output of digital demultiplexer 68. The outputs of digital tuners 82 and 84 are connected to a bank of digital filters 86. A digital demodulator 88, coupled to the bank of digital filters 86, outputs a digital signal 90.

The operation of the pre-processing unit 101 and the transmission of the format converted pre-processed signal through digital transmission link 70, as shown in FIG. 6, is similar to that described above with reference to FIG. 5. However, the post-processing unit 30 in this embodiment comprises a digital demultiplexer 68 that outputs a digital signal containing the digitized system input signal and the digitized control signal to digital tuners 82 and 84. Digital tuner 82 may be provided to remove the digitized system input signal from the digitized control signal, and pass only the digitized control signal to digital filter bank 86. Further, digital tuner 84 may be provided for removing the digitized control signal from the digitized system input signal, and passing only the digitized system input signal to digital filter bank 86. After the bank of digital filters 86 receives the digitized system input signal and the digitized control signal, it issues a digital representation of the system RF or analog input signal 36. The digital representation of the system RF or analog input signal 36 is applied to digital demodulators 88 for further processing of the signal to provide digital output signal 90. As noted above with respect to FIG. 4, the processing performed by digital demodulators 88 may include converting the digital signals to a compatible or other suitable format for end-use devices.

The digital tuners and the digital filter bank employed in the present invention may be of conventional design, e.g., such as manufactured by Watkins and Johnson Company or Steinbrecher Company, and/or any functionally equivalent design. In addition, digital tuners 82 and 84 are designed so that each tuner has the equivalent of a specified and software-programmable instantaneous center frequency and bandwidth, that is implemented in a time domain representation using digital signal processing.

Similar to that in the embodiment of FIG. 4, the bank of digital filters 86 in FIG. 6 may employ an algorithm substantially similar to the algorithm described in U.S. Pat. No. 5,321,849, except the algorithm processes a digitally formatted signal. In other words, the system RF or analog input signal is implemented and processed in the time domain using digital signal processing.

As noted above, the bank of digital demodulators 88 may convert the signal from the bank of digital filters 86 into formats that are compatible with a variety of end-use devices, including: cellular or wire telephone switches; analog or digital switches; a network interface to a called party; and, a device for selecting and passing on the best quality transmitted signal received over several antennas.

Figure 7:
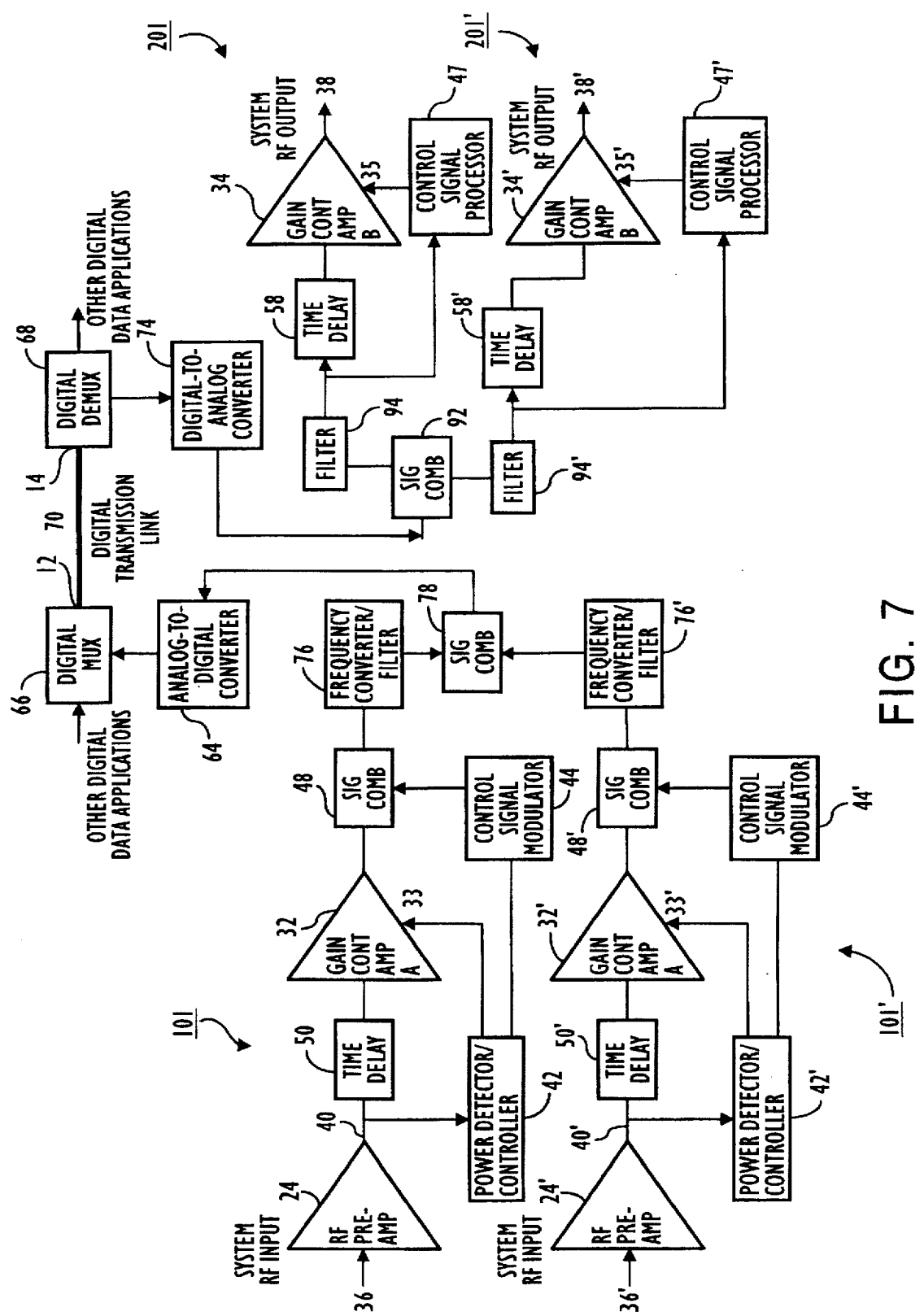
FIG. 7 is a block diagram illustrating a sixth embodiment of a dynamic range enhancing system according to the present invention, employing a control signal encoded with information to directly control the post-processing unit, including two input signals of different frequencies that are combined before transmission over a digital link.

Referring now to FIG. 7, a sixth embodiment of the present invention will be described, that employs a pair of pre-processing units 101 and 101' and a pair of post-processing units 201 and 201'.

The sixth amendment of the present invention is capable of handling and processing more than one RF or analog input signal for transmission along a digital link. As shown in FIG. 7, a plurality of system RF or analog input signals 36 and 36' are provided for transmission through digital transmission link 70. While FIG. 7 only shows two system input signals, this embodiment may be modified by, for example, adding the appropriate number of pre-processing and post-processing units, signal combiners, and filters, to process more than two system input signals.

The input signals in FIG. 7 may be of different frequencies and applied to respective pre-processing units 101 and 101'. Each pre-processing unit 101 and 101' is substantially identical to the pre-processing unit 101 shown in the fourth embodiment of the invention, which is described above with reference to FIG. 5. In the sixth embodiment, however, frequency converter/filters 76 and 76' are connected to the respective outputs signal combiners 48 and 48', with the respective outputs of frequency converter/filters 76 and 76' being combined in signal combiner 78 and the resultant combined signal provided as input to analog-to-digital converter 64. As shown in FIG. 7, the output of analog-to-digital converter 64 is connected to digital multiplexer 66 at a first end or input 12 of digital transmission link 70.

In the sixth embodiment, a digital demultiplexer 68 provided at the remote end 14 of digital transmission link 70 is coupled to the input of digital-to-analog converter 74. A signal combiner 92 is provided having an input that is connected to the output of digital-to-analog converter 74 and output that is connected to the inputs of filters 94 and 94'. The outputs of filters 94 and 94' are coupled to post-processing units 201 and 201', which have a similar design and function as the post-processing unit described above with reference to the fourth embodiment (see FIG. 5).

As discussed above, system RF or analog input signals 36 and 36' are provided as input to pre-processing units 101 and 101'. These signals may be in the same frequency band or in different frequency bands, and are processed by pre-processing units 101 and 101' in a manner substantially similar to that described above with respect to the embodiment shown in FIG. 5. In the sixth embodiment, however, the pre-processed signals from signal combiners 48 and 48' are applied to frequency converters 76 and 76', respectively. Frequency converter/filters 76 and 76' convert the pre-processed signals to frequencies within the bandwidth of analog-to-digital converter 64 to enable concurrent format conversion and transmission of the input signals. The frequency converted pre-processed signals are then combined in signal combiner 78 to produce a single composite signal and then format converted in analog-to-digital converter 64. Analog-to-digital converter 64 may convert the composite signal into a time division multiplexed (TDM) serial bit stream. The bit stream is applied into an input of digital multiplexer 66, where it may be combined with other digital signals (e.g., for various digital data applications) to be transmitted over digital transmission link 70.

The digitized signal is transmitted over digital transmission link 70 and, at the remote end 14, digital demultiplexer 68 strips off (i.e., removes) any of the other digital signals and sends the demultiplexed bit stream containing the format converted composite signal to digital-to-analog converter 74. The resultant output of the digital-to-analog converter 74 is applied to a signal combiner 92, which splits the composite signal (i.e., sends two signals out identical to the signal in) to be input into respective filters 94 and 94'. Filters 94 and 94' separate, or select, the portions of the respective signal of particular interest for adjustment and for gain correction in post-processing units 201 and 201'.

Accordingly, in the sixth embodiment, the signal at system RF output 38 is substantially the same as the signal applied to system RF input 36, and the signal at system RF output 38' is substantially similar to the signal at system RF input at 36'. Further, this embodiment maintains an overall constant gain (or loss) that is independent of the input level of the signals.

Figure 8:
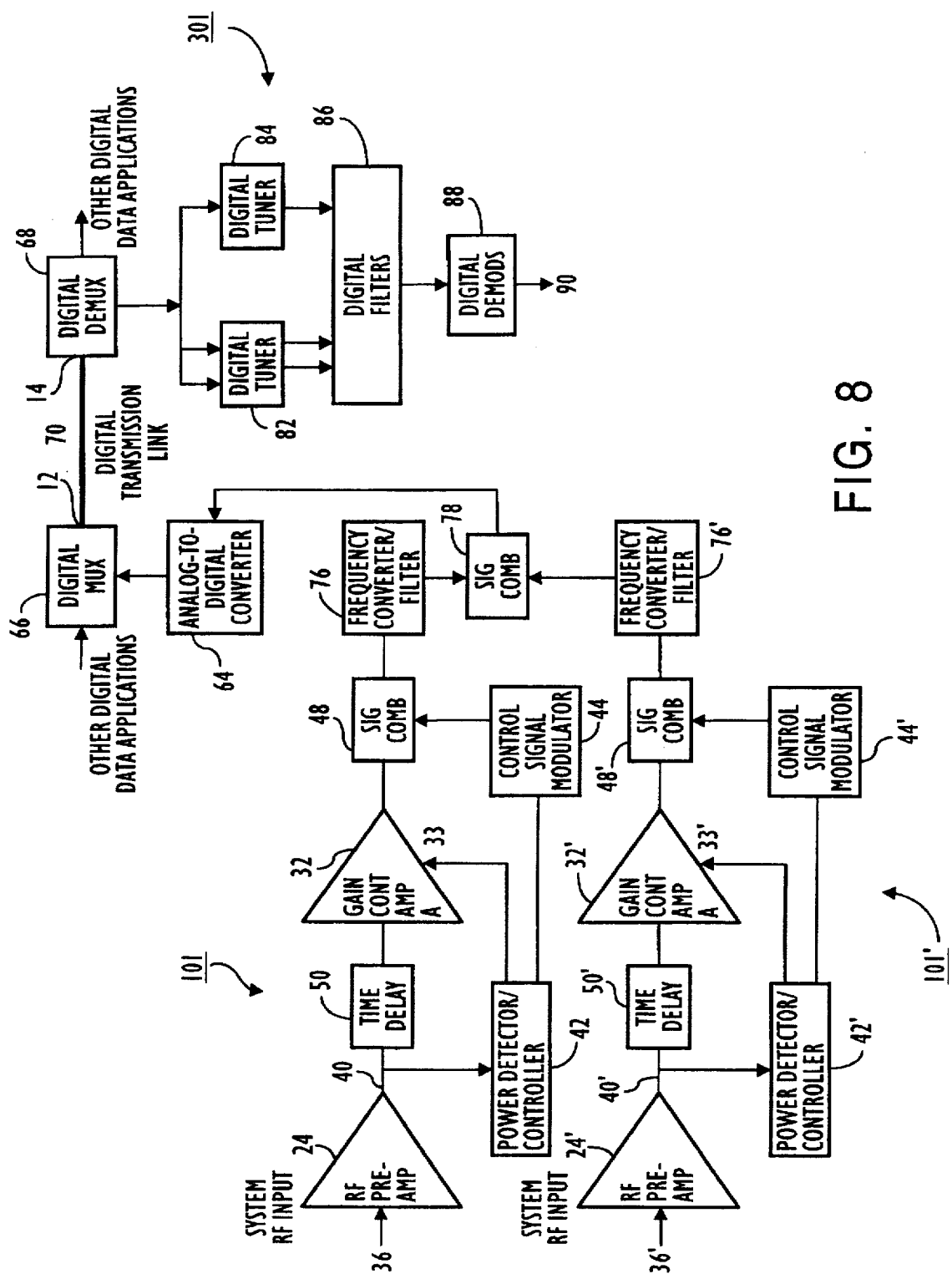
FIG. 8 is a block diagram illustrating a seventh embodiment of a dynamic range enhancing system of the invention, employing a control signal encoded with information to directly control the post-processing unit and digital tuners and digital filters, the digital tuners having a number of control line inputs equal to the number of input signals combined.

FIG. 8 shows a seventh embodiment of the present invention, which is similar to the sixth embodiment described above with reference to FIG. 7, except that a post-processing unit 301' has been provided for outputting a digital signal representation of the system RF or analog input signal. As shown in FIG. 8, post-processing unit 301' includes a plurality of digital tuners 82 and 84 are which have inputs that are connected to a split signal output of digital demultiplexer 68 and outputs that are connected to a bank of digital filters 86. While digital tuner 82 is shown in FIG. 8 with two inputs that are coupled to digital demultiplexer 68, tuner 82 could alternatively be configured to include two separate digital tuners that each comprise one input that is coupled to digital demultiplexer 68. A digital demodulator 88 may also be provided, which receives input from the bank of digital filters 86 and outputs a digital signal 90.

Similar to as was the case with the sixth embodiment, the embodiment of FIG. 8 may receive a plurality of system RF or analog input signals, which may be within the same or different frequency bands, for transmission through digital transmission link 70. In operation, the pre-processing of the signal in FIG. 8 and the transmission of the format converted composite signal through digital transmission link 70 is similar to that described above with reference to FIG. 7.

However, in the embodiment of FIG. 8, a different post-processing operation of the signals is performed. Digital demultiplexer 68 separates the other digital data added by digital multiplexer 66 and outputs a split digital signal to the plurality of digital tuners of post-processing unit 301. Digital tuner 82, illustrated in FIG. 8 with two inputs, may be provided for removing the digitized system input signal from each of the digitized control signals, and passing each of the digitized control signals to digital filter bank 86. Further, digital tuner 84 may be provided to remove the digitized control signals from the digitized system input signals, and pass only the digitized system input signals to digital filter bank 86. The digitized system input signal passed to the digital filter bank 86 is a composite signal of both pre-processed input signals. The bank of digital filters 86 receives the digitized system input signals and the digitized control signals, and outputs a digital representation of the system RF or analog input signals 36 and 36'. The digital representation of the system RF or analog input signal 36 is applied to a digital demodulator 88 for further processing of the signal to provide digital output signal 90.

In accordance with an aspect of the invention, digital tuner 84 may include the equivalent of a specified and software-programmable instantaneous center frequency and bandwidth, that is implemented in time domain representation using digital signal processing. Further, since digital tuner 82 processes a plurality of control signals equal to the number of pre-processed system RF or analog input signals, digital tuner 82 may, therefore, includes an equivalent of a specified and software-programmable instantaneous center frequency and bandwidth for each of the plurality of control signals. Digital tuner 82 may process the plurality of control signals concurrently with the processing of the digitized system input signal representing, for example, cellular telephone subscribers calls.

Digital tuners 82 and 84 feed a bank of digital filters 86, which may further process the individual signals by a specified algorithm. Digital filters 86 may use an algorithm as described above with reference to FIGS. 4 and 6. In other words, digital filters 86 in FIG. 8 may employ an algorithm substantially similar to the algorithm described in U.S. Pat. No. 5,321,849, except that the algorithm processes a digitally formatted signal. In other words, the system RF or analog input signal is implemented and processed in the time domain using digital signal processing.

Similar to the embodiments of FIGS. 4 and 6, digital demodulators 88 may include processing for converting signals from digital filters 86 into formats that are compatible with a variety of end-use devices, including cellular or wire telephone switches (e.g., a 64 kbps representation of a voice signal known as DS0); analog or digital switches, network interface to a called party; and a device for selecting and passing on the best quality transmitted signal received over several antennas.

Figure 9:
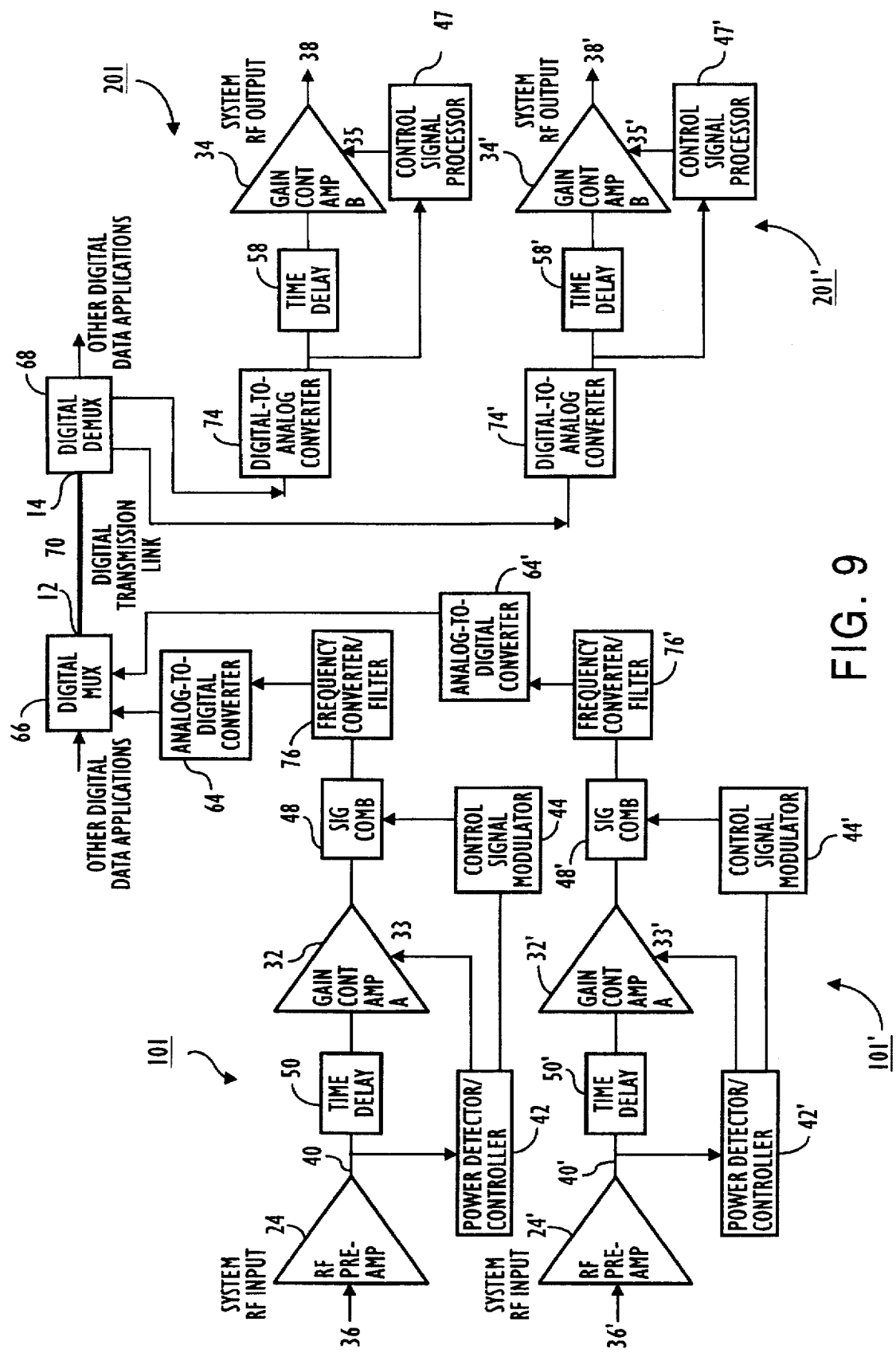
FIG. 9 is a block diagram of an eighth embodiment of a dynamic range enhancing system of the invention, employing a control signal encoded with information to directly control the post-processing unit, wherein each input signal is individually format converted before transmission over a digital link.

FIG. 9 shows an eighth embodiment of the present invention which is similar to the sixth embodiment described in FIG. 7, except that the plurality of pre-processed signals are individually format converted through respective analog-to-digital converters, transmitted, and individually converted and post-processed. In FIG. 9, the pre-processing units 101 and 101' are connected to a pair of analog-to-digital converters 64 and 64' through frequency converted/filters 76 and 76'. Analog-to-digital converters 64 and 64' are each connected to digital multiplexer 66 provided at the first end or input 12 of transmission link 70. The remote end or output 14 of transmission link is coupled to digital demultiplexer 68, which is connected to post-processing units 201 and 201' through respective digital-to-analog converters 74 and 74'.

In the eighth embodiment of the present invention, system RF or analog input signals 36 and 36', which may be signals of different frequencies, are separately pre-processed in pre-processing units 101 and 101'. The pre-processing units 101 and 101' are functionally equivalent to the pre-processing unit 101 described above with reference to FIG. 5; and, thus, a detailed description of their operation is not repeated herein. The pre-processed output of the respective pre-processing units 101 and 101' is applied to respective analog-to-digital converters 64 and 64' through frequency converter/filters 76 and 76'. The frequency converter/filters 76 and 76' allow the pre-processed RF or analog input signals to be converted to fit within the given bandwidth of analog-to-digital converters 64 and 64' for format conversion. The format converted signals are then multiplexed by digital multiplexer 66 for transmission through digital transmission link 70. As discussed above, digital multiplexer 66 may multiplex other digital data with the digital-format converted signals.

Digital demultiplexer 68, located at the remote end 14 of digital transmission link 70, strips off any of the other digital signals added by digital multiplexer 66 and outputs the format converted RF or analog input signals and control signals to digital-to-analog converters 74 and 74' so that they converted into analog format. The resultant analog based signals are then applied to post-processing units 201 and 201' which function in a manner similar to the post-processing unit described in the fourth embodiment of the invention shown in FIG. 5. The post-processing units 201 and 201' provide system RF or analog output signals 38 and 38' that are substantially similar to the system RF or analog input signals 30 and 30'. Further the dynamic range enhancing system for this embodiment maintains a nearly constant overall gain (or loss) that is independent of the respective input levels of the signals.

A ninth embodiment of the present invention, which contains similar signal pre-processing to that of the eighth embodiment shown in FIG. 9, will now be described with reference to in FIG. 10. The ninth embodiment of the present invention, however, differs from the eighth embodiment in that the output of the digital demodulator 68 outputs a plurality of digitized control signals and a plurality of digitized system input signals for signal post-processing and outputting of digital representations of the system RF or analog input signals 36 and 36'.

Figure 10:
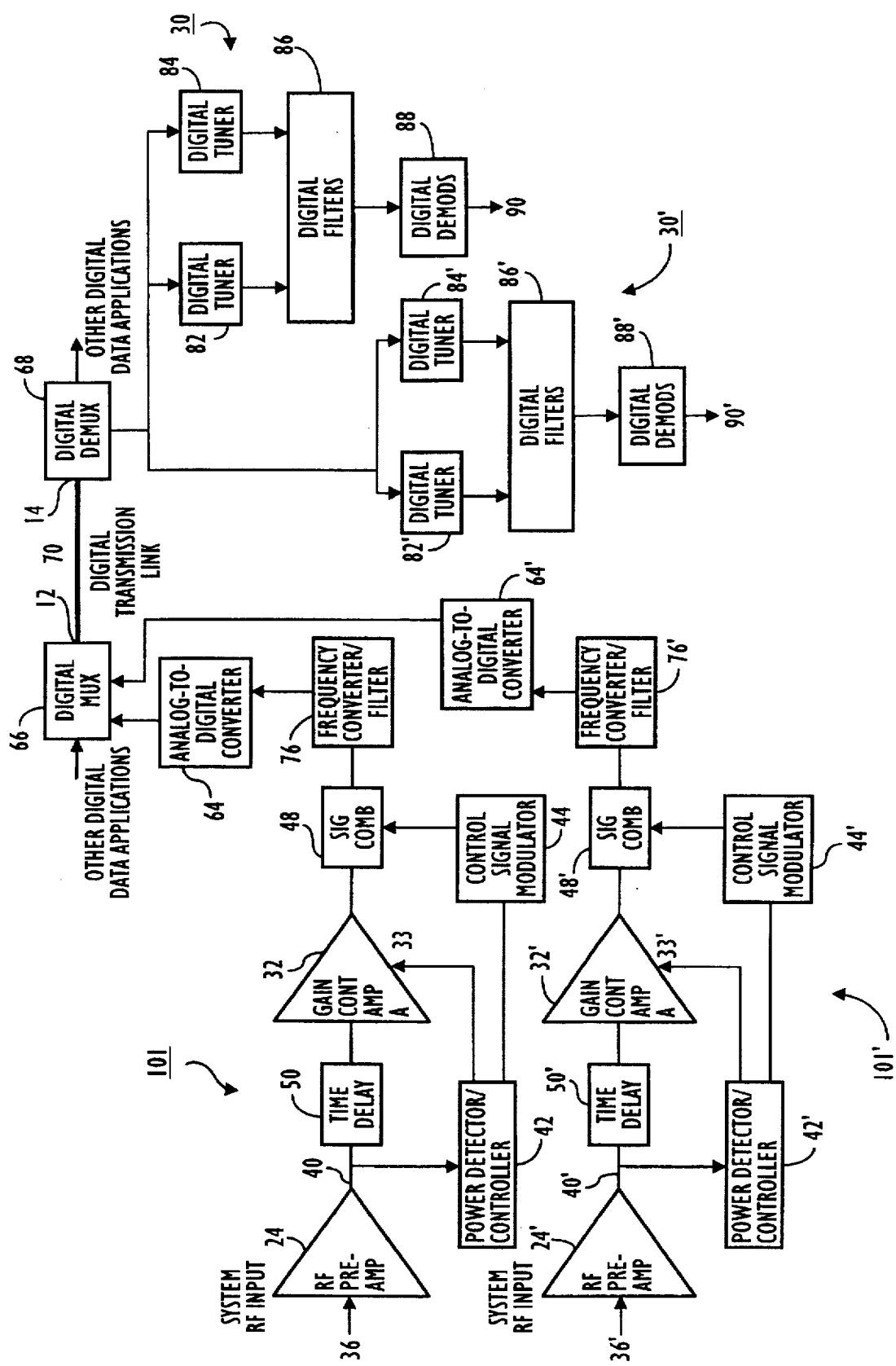
FIG. 10 is a block diagram of a ninth embodiment of a dynamic range enhancing system according to the present invention, employing a control signal encoded with information to directly control the post-processing unit and a digital tuner and digital filter for each input signal transmitted through a digital transmission link.

In the embodiment shown in FIG. 10, the system includes pre-processing units 101 and 101' that are similar to that of the eighth embodiment. However, at the remote end or output 14 of transmission link 70, digital demultiplexer 68 is provided to separate the other digital signals and outputs a split signal to a plurality of digital tuners 82, 84, 82', and 84'. The digital tuners are grouped such that digital tuners 82 and 84 are applied to a bank of digital filters 86 and digital tuners 82' and 84' provide output to a bank of digital filters 86'. Digital demodulators 88 and 88' may be provided for receiving input from digital filter banks 86 and 86', respectively and producing output signals 90 and 90'.

The operation of the pre-processing units 101 and 101' and transmission of the system RF or analog input signals 36 and 36' is similar to that described above with reference to FIG. 9; and, thus, a description of the same is not repeated herein. However, a description of the post-processing performed by the embodiment of FIG. 10 is provided below. At the remote end 14 of transmission link 70, digital demultiplexer 68 separates out the other digital data application signals and outputs a split signal for post-processing in respective post-processing units 30 and 30'. The split signal is applied to a plurality of digital tuners 82, 84, 82' and 84', each of which may include an equivalent of a specified and software-programmable instantaneous center frequency and bandwidth, that is implemented in time domain representation using digital processing. Digital tuners 82 and 82' may be provided for removing each of the digitized system input signals from the digitized control signals, and passing only the respective control signals to digital filter bank 86. Further, digital tuners 84 and 84' may be provided to remove each of the digitized control signals from the digitized system input signals, and passing their respective digitized system input signals to digital filter bank 86. The bank of digital filters 86 receives the digitized system input signals and the control signals, and outputs digital representations of the system RF or analog input signals 36 and 36'. The digital representations of the system RF or analog input signals 36 and 36' are applied to a digital demodulator 88 for further processing of the signal to provide a digital output signal 90.

The bank of digital filters 86 may include an algorithm substantially similar to the algorithm described in U.S. Pat. No. 5,321,849, except that the algorithm is implemented in the time domain using digital signal processing. Further, the digital demodulators 88 may include processing to convert the signals from digital filters 86 into formats that are compatible with a variety of end-use devices. As noted above, such end-use devices may include: cellular or wire telephone switches; analog or digital switches; network interface with a called party; and a device for selecting and passing on the best quality transmitted signal received over several antennas.

Figure 11:
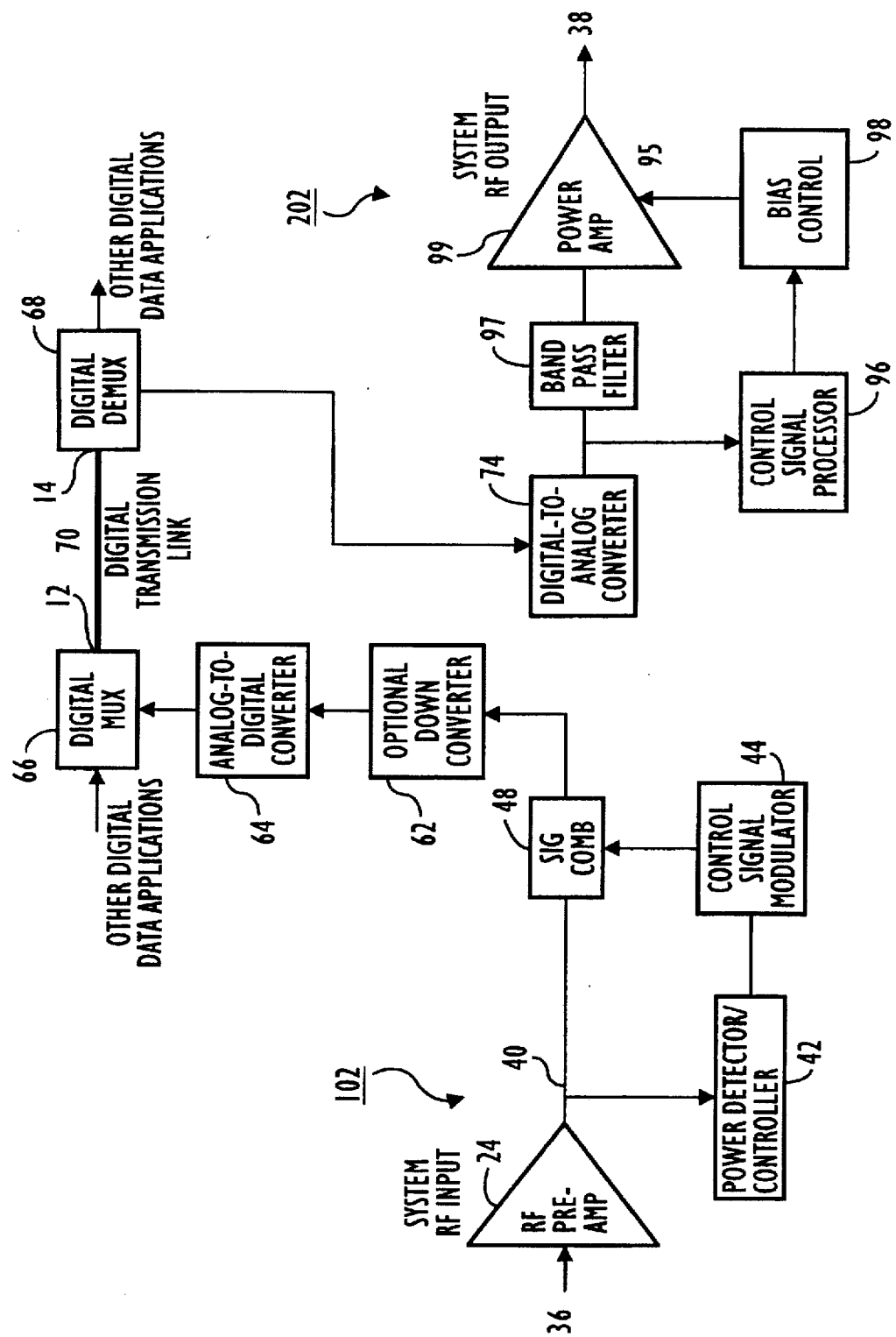
FIG. 11 is a block diagram of a tenth embodiment of a digital range enhancing system of the invention, wherein the current drain of a remote transmit power amplifier is controlled using a digital transmission link.

The tenth embodiment of the present invention, as shown in FIG. 11, will now be described. This embodiment includes a pre-processing unit 102 and a post-processing unit 202 that differ from that of the embodiments described above. In particular in the embodiment of FIG. 11, the system RF or analog input signal is not adjusted prior to transmission through the transmission link, nor is the transmitted signal equally and oppositely adjusted to provide the system RF or analog output signal.

As shown in FIG. 11, system RF or analog input signal 36 is applied to RF preamplifier 24. An output 40 of RF preamplifier 24 is connected to power detector/controller 42 and to signal combiner 48. Control signal modulator 44 includes an input that is coupled to an output of power detector/controller 42, and provides an output to signal combiner 48. The output of signal combiner 48 is provided as input to a digital multiplexer 66, located at a first end 12 of digital transmission link 70, through an optional down converter 62 and an analog-to-digital converter 64.

At the remote end 14 of digital transmission link 70, digital demultiplexer 68 is provided which outputs a demultiplexed digital signal to a digital-to-analog converter 74. Digital-to-analog converter 74 is coupled to a control signal processor 96 and to a power amplifier 99 through a bandpass filter 97. Control signal processor 96 is connected to a bias control device 98, which is coupled to a programmable control input 95 of power amplifier 99. Based on the control signal from bias control device 98, power amplifier 99 is adjusted and generates a system RF or analog output signal.

In the tenth embodiment of the invention, the system RF or analog input signal 36 is amplified by preamplifier 24 and provided at output 40. A portion of the amplified signal at output 40 is provided to power detector/controller 42, which determines the amplitude of the systems input signal and, based on this determination, generates a control signal to control signal modulator 44. Signal modulator 44 produces an RF carrier modulated by the control signal which is indicative of the input signal level detected by power detector/controller 42. The remaining portion of the amplified system input signal at output 40 is applied to a signal combiner 48 for combining the amplified signal with the modulated control signal from control signal modulator 44.

The combined signal from signal combiner 48 may be inputted to an optional down converter 62 that converts the frequency of combined signal into a frequency low enough for format conversion by analog-to-digital converter 64. The format conversion performed by analog-to-digital converter 64 may convert the analog signal into a time domain multiplexed (TDM) serial bit stream or any other suitable type of bit stream. The resultant bit stream is applied to a digital multiplexer 66 for transmission through transmission link 70. Digital multiplexer 66 may combine digital signals of other digital data application with the resultant bit stream for transmission over link 70.

As shown in FIG. 11, at the remote end 14 of transmission link 70, digital demultiplexer 68 is provided to separate any of the other digital data application signals and to pass the digital format converted signal to digital-to-analog converter 74. A portion of the resultant output of digital-to-analog converter 74 is applied to control signal processor 96 for isolating and demodulating the control signal data from the system input signal. The demodulated control signal is then provided as input to bias control device 98. In response to the control data detected, bias control device 98 issues a control signal to programmable control input 95 to adjust the gain of power amplifier 99. The remaining portion of the output of digital-to-analog converter 74 is filtered by bandpass filter 97 and then applied to the adjusted power amplifier 99. As a result, the system RF or analog output signal 38 is provided at the output of power amplifier 99.

The tenth embodiment of the present invention does not require the pre-processing and post-processing units of the previously described embodiments. Instead, since the dynamic range of conventional analog-to-digital and digital-to-analog converters is usually adequate for downlink signals, the function of the control signal modulator and control signal processor is to perform a biasing control function. This arrangement reduces the current drain and potentially reduces the transmitted noise level when the system is operating in a standby condition.

Figure 12:
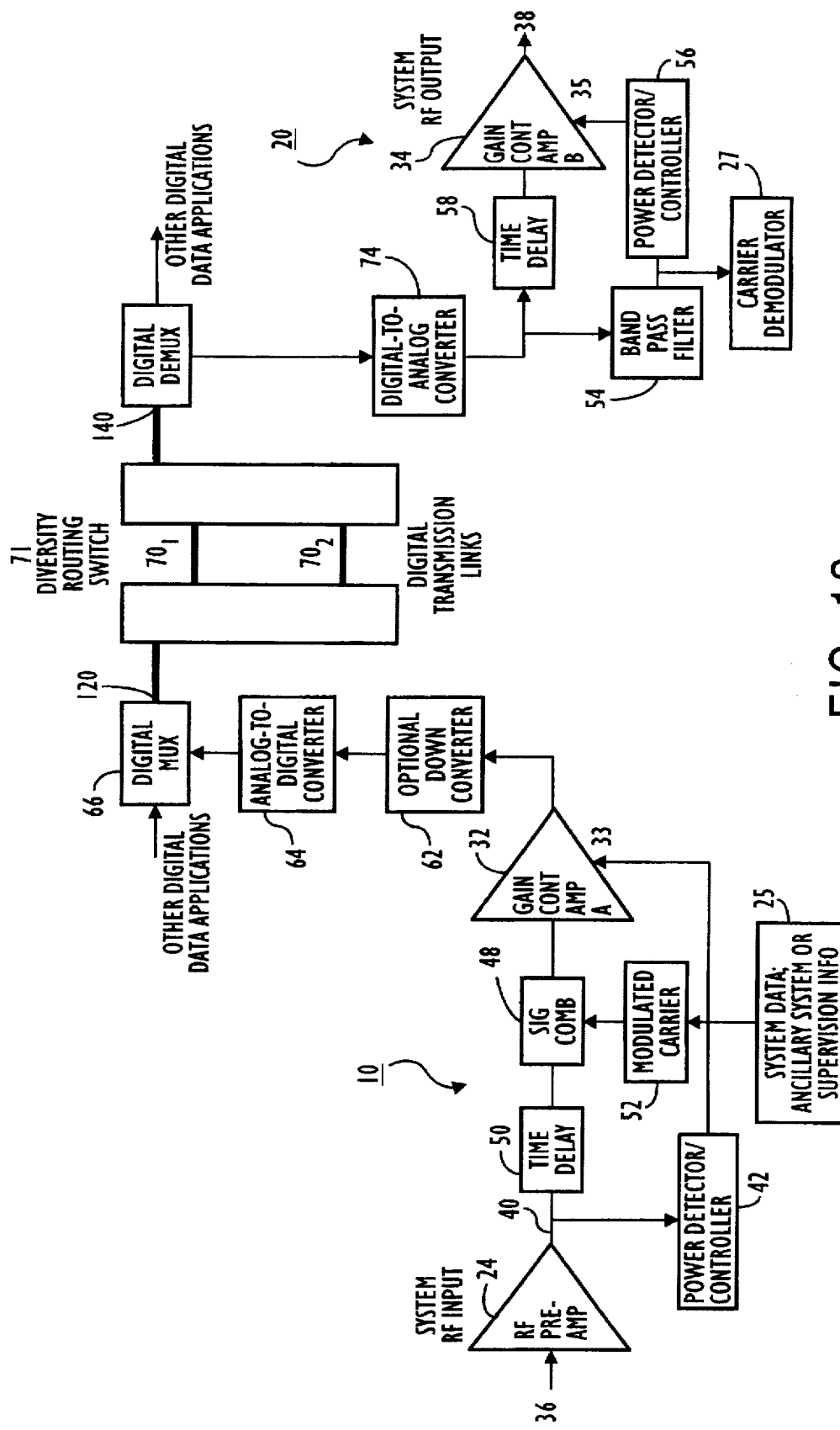
FIG. 12 is a block diagram of an eleventh embodiment of a dynamic range enhancing system according to the present invention, for applying a transmission signal through a diversity routing switch.

An eleventh embodiment of the invention, shown in FIG. 12, will now be described which relates to transmission of a digital signal through a diversity routing switch including a pair of digital transmission links. In FIG. 12, a pre-processing unit 10 is illustrated that is substantially similar to that described in the second embodiment of the present invention, discussed above in detail with reference to FIG. 3. Thus, a detailed description of pre-processing unit 10 is not repeated herein. However, in this embodiment, digital multiplexer 66 is connected to a diversity routing switch 71 at a first end 120 of the switch. The routing switch 71 includes a pair of digital transmission links $70_1$, and $70_2$. At the remote end 140 of diversity routing switch 71 a digital demultiplexer 68 is provided which is coupled to a digital-to-analog converter 74. The post-processing unit 20 in FIG. 12 is connected to converter 74 and is substantially similar to that disclosed in the second embodiment shown in FIG. 3; and, as such, a detailed description of the same is not repeated herein.

The two parallel, digital transmission links $70_1$ and $70_2$, of diversity routing switch 71 improve the overall system reliability. Prior to the present invention, separate transmission rates for input signals and control signals would create a synchronization problem due to the different transmission paths employed upon switching. The advantage of this embodiment of the present invention is that even though the physical transmission paths $70_1$ and $70_2$ are different upon switching, there is no synchronization challenge since the input signal and control signal are combined prior to transmission through the diversity routing switch 71.

Figure 13:
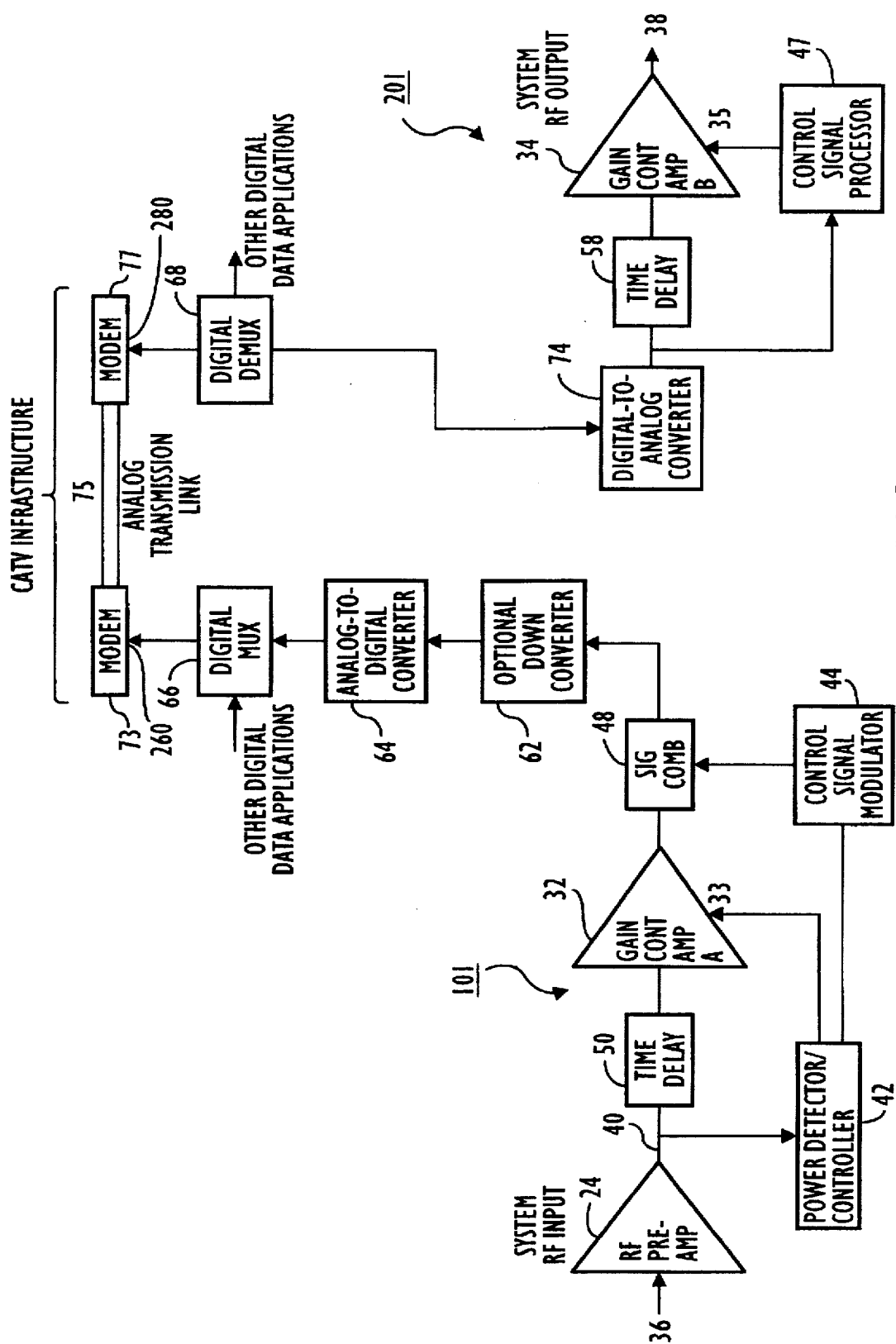
FIG. 13 is a block diagram of a twelfth embodiment of a dynamic range enhancing system according to the present invention, employing a control signal encoded with information to directly control the post-processing unit, for applying a signal to a CATV infrastructure configuration.

A twelfth embodiment of the present invention is illustrated in FIG. 13. In this embodiment, the digital transmission link 70 is replaced with an optional digital transmission link, e.g., a CATV infrastructure. This type of arrangement for digital transmission is desirable, for example, in an analog microwave radio system. Specifically, the pre-processing of system RF or analog input signal 36, the format conversion, and the digital multiplexing of the signal with other digital data applications is accomplished in a manner similar to that described above with regard to the fourth embodiment (see FIG. 5). However, in this embodiment, the output of digital multiplexer 66 is coupled at a first end 260 of an analog transmission link 75 through a first modem 73. A digital demultiplexer 68 is coupled to the remote end 280 of analog transmission link 75 through a second modem 77. The digital demultiplexer 68 separates any of the other digital data applications and pass the digital format converted input signal and the control signal to digital-to-analog converter 74. A post-processing unit 201 arrangement is provided in this embodiment which is similar to that set forth in the fourth embodiment of the present invention, to provide a dynamic range enhancing system with a nearly constant overall gain (or loss) independent of the input signal level.

In the embodiment of FIG. 13, modems 73 and 77 may be of conventional design for converting a digital signal to an analog signal, at a high rate of sampling, for transmission along an analog transmission link and reconverting, at the opposite end of the link, the transmitted signal back into digital form. Modems 73 and 77 may also operate in accordance with substantially all conventional protocols for processing the transmit signals for transmission over analog transmission links.

Moreover, in any of the above described embodiments, either or both of the variable gain amplifiers may be optionally replaced with a fixed gain amplifier and variable attenuator, which in turn optionally may incorporate a digitally controlled step attenuator. Additionally, various types of transmissions links may be utilized. For example, links comprising digital optical fiber, digital radio, digital free-space optical, digital wire line, coaxial cable, ADSL or HDSL modems on twisted copper wire, RF digital modems, digital magnetic tape, photographic film or optical disk media may be utilized.

Additionally, various features incorporated by reference from U.S. Pat. No. 5,321,849 may be adapted for use with the dynamic range enhancing system of the present invention. Those features include: the self-test function (see, e.g., FIG. 7); the remote power amplifier (see, e.g., FIG. 8); multiple frequency bands (see, e.g., FIG. 9); and, use of frequency converters (see, e.g., FIG. 12).

It should be noted that the foregoing examples have been provided merely for the purpose of explanation and are in no way to be construed as limiting of the present invention. While the invention has been described with reference to several exemplary embodiments, it is understood that the words which have been used herein are words of description and illustration, rather than words of limitation. Changes may be made, within the purview of the appended claims, as presently stated and as amended, without departing from the scope and spirit of the invention in its aspects. Although the invention has been described herein with reference to particular means, materials and embodiments, the invention is not intended to be limited to the particulars disclosed herein; rather, the invention extends to all functionally equivalent structures, methods and uses, such as are within the scope of the appended claims.

What is claimed:

1. A dynamic range enhancing system for enhancing performance of a transmission link by controlling a transmit signal to be transmitted along a communication path comprising said transmission link, said transmission link extending from a first location to a second location remote from said first location, said system comprising:

a pre-processing unit, provided at said first location, that receives, as input, said transmit signal, said pre-processing unit comprising a first signal level adjusting means for adjusting a signal level of said transmit signal to be transmitted over said transmission link, and means for transmitting said adjusted transmit signal over said transmission link; and a post-processing unit provided at said second location that receives, as input, said adjusted transmit signal transmitted over said communication link, said post-processing unit comprising a second signal level adjusting means for adjusting a signal level of said adjusted transmit signal transmitted over said transmission link;

said pre-processing unit further comprising control means for controlling said first signal level adjusting means and said second signal level adjusting means, such that the overall system gain is substantially constant, said control means comprising means for detecting the signal level of said transmit signal at an input of said pre-processing unit, means for generating a first control signal for controlling said first signal level adjusting means based on the signal level detected by said detecting means, means for generating a second control signal for controlling said second signal level adjusting means based on the signal level detected by said detecting means, said second control signal comprising a constant amplitude signal, combining means for combining said transmit signal and said second control signal before said transmit signal has been adjusted by said first signal level adjusting means, and means for transmitting said second control signal with said adjusted transmit signal over said transmission link to said post-processing unit.

2. The dynamic range enhancing system of claim 1, said system further comprising a format converting means for converting an analog signal into digital form, wherein said transmit signal is converted before being transmitted over said transmission link.

3. The dynamic range enhancing system of claim 1, said first signal level adjusting means comprising a gain controlled amplifier, wherein a gain of said gain controlled amplifier is adjusted according to said first control signal.

4. The dynamic range enhancing system of claim 1, said transmission link comprises an analog transmission link.

5. The dynamic range enhancing system of claim 1, said transmission link comprises a digital transmission link.

6. The dynamic range enhancing system of claim 5, said digital transmission link comprising digital modulating means for modulating said transmit signal with other signals for transmission over said transmission link and digital demodulating means for removing said transmit signal from the other signals for post-processing of said transmit signal.

7. The dynamic range enhancing system of claim 1, said means for generating said second control signal comprising constant amplitude RF carrier means.

8. The dynamic range enhancing system of claim 1, said means for generating said second control signal comprising constant energy signal means.

9. The dynamic range enhancing system of claim 1, said pre-processing unit further comprises time delay means for compensating for processing time in said first signal level adjusting means.

10. The dynamic range enhancing system of claim 1, said pre-processing unit comprising:

a system data device for providing system data, including ancillary system control and supervision information; said system data, carried by said control signal, being transmitted through said transmission link.

11. The dynamic range enhancing system of claim 1, said post-processing unit comprising:

means for receiving said second control signal;

means for determining an amplitude variation of said second control signal from a constant amplitude control signal;

said second signal level adjusting means is adjusted according to the determined amplitude variation.

12. The dynamic range enhancing system of claim 1, said post-processing unit comprising:

a plurality of digital tuners for concurrently processing said adjusted transmit signal and said adjusted control signal.

13. The dynamic range enhancing system of claim 12, said digital tuners comprising specified and programmable instantaneous center frequencies and bandwidths implemented in time domain representation using digital processing.

14. The dynamic range enhancing system of claim 12, said post-processing unit comprising:

a plurality of digital tuners for concurrently processing a plurality of transmit signals and a plurality of second control signals.

15. The dynamic range enhancing system of claim 1, said post-processing unit comprising:
    means responsive to said second control signal for adjusting said second signal level adjusting means.

16. The dynamic range enhancing system of claim 1, said post-processing unit comprising a band pass filter for passing said adjusted transmit signal to said second signal level adjusting means.

17. The dynamic range enhancing system of claim 1, said post-processing unit comprising time delay means for compensating for processing time in said second signal level adjusting means.

18. The dynamic range enhancing system of claim 1, said post-processing unit comprising format converting means for converting said adjusted transmit signal from a digital signal to analog form.

19. The dynamic range enhancing system of claim 1, said second signal adjusting means comprising a gain controlled amplifier, in which a gain of said gain controlled amplifier is adjusted according to said second control signal.

20. The dynamic range enhancing system of claim 1, said transmission link comprises a diversity routing switch including a plurality of digital transmission links.

21. The dynamic range enhancing system of claim 4, said analog transmission link further extending between a pair of modems, a first modem being disposed between said pre-processing unit and said analog transmission link and a second modem being disposed between said post-processing unit and said analog transmission link;
    wherein said first modem converts digital signals from said pre-processing unit into analog form for transmission over said analog link and said second modem converts said transmitted analog signal into digital form for application to said post-processing unit.

22. The dynamic range enhancing system of claim 5, said digital transmission link comprising:
    an analog transmission link further extending between a pair of modems;
    a first modem being disposed between said pre-processing unit and said analog transmission link; and
    a second modem being disposed between said post-processing unit and said analog transmission link;
    wherein said first modem converts digital signals from said pre-processing unit into analog form for transmission over said analog link and said second modem converts said transmitted analog signal into digital form for application to said post-processing unit.

23. A dynamic range enhancing system for enhancing performance of a digital transmission link by controlling a transmit signal adapted to be transmitted over said digital transmission link within a communication path, said digital transmission link extending from a first location to a second location remote from the first location, said system comprising:
    control means for detecting, at an initial position along the communication path, a level of the transmit signal, and for controlling first signal level adjusting means and second signal level adjusting means in response to the detected level;
    said first signal level adjusting means comprising means for adjusting the signal level of said transmit signal before transmission over said digital link, and said second signal level adjusting means comprising means for adjusting the level of said transmit signal after transmission over said digital link, said control means controlling said first and second signal level adjusting means to adjust the signal level of said transmit signal in a coordinated fashion based on the detected level;
    said first and second signal level adjusting means respectively comprising first and second outputs and means for adjusting the level of the transmit signal present at said first and second outputs; and
    said control means comprising means for controlling said first and second signal level adjusting means so that:
    the transmit signal level is decreased at the first output and increased at the second output when the detected transmit signal level increases, and
    the transmit signal level is increased at the first output and decreased at the second output when the detected transmit signal level decreases.

24. The dynamic range enhancing system of claim 23, said system further comprising:
    a pre-processing unit, for processing the transmit signal before transmission through said digital transmission link, comprising said control means and said first signal level adjusting means, said control means further comprising a first output for providing a first control signal and a second output for providing a second output, said first control signal controls said first signal level adjusting means and said second control signal controls said second signal level adjusting means; and
    a post-processing unit, for processing said transmit signal after transmission through said digital transmission link, comprising said second signal level adjusting means.

25. The dynamic range enhancing system of claim 24, wherein said control means comprises modulation means for modulating said second control signal.

26. The dynamic range enhancing system of claim 25, wherein said modulation means modulates according to at least one of amplitude modulation, amplitude shift keying, frequency modulation, frequency shift keying, phase modulation, phase shift keying.

27. The dynamic range enhancing system of claim 24, said system further comprising:
    combining means, coupled to said first signal adjusting means, for combining said transmit signal and said second control signal,
    wherein said transmit signal is adjusted by said first signal adjusting means before said combining means combines said transmit signal and said control signal.

28. The dynamic range enhancing system of claim 23, said system further comprising a format converting means for converting an analog signal into digital form, wherein said transmit signal is converted before being transmitted over said transmission link.

29. The dynamic range enhancing system of claim 24, said first signal level adjusting means comprising a gain controlled amplifier, wherein a gain of said gain controlled amplifier is adjusted according to said first control signal.

30. The dynamic range enhancing system of claim 23, said digital transmission link comprising digital modulating means for modulating said transmit signal with other signals for transmission over said transmission link and digital demodulating means for removing said transmit signal from the other signals for post-processing of said transmit signal.

31. The dynamic range enhancing system of claim 23, said pre-processing unit further comprises time delay means for compensating for processing time in said first signal level adjusting means.

32. The dynamic range enhancing system of claim 24, said pre-processing unit comprising:

a system data device for providing system data, including ancillary system control and supervision information;

said system data, carried by said control signal, being transmitted through said transmission link.

33. The dynamic range enhancing system of claim 24, said system further comprising:

a plurality of pre-processing units for processing a plurality of transmit signals;

frequency converting means for converting a frequency of said transmit signal to be within a predetermined range;

format converting means for converting an analog signal to a digital form for transmission over said transmission link.

34. The dynamic range enhancing system of claim 33, said system further comprising combining means for combining each of the plurality of frequency converted transmit signals, such that a single signal is format converted before transmission over said transmission link.

35. The dynamic range enhancing system of claim 33, wherein said format converting means comprises a plurality of format converting means, such that each of the plurality of frequency converted transmit signal is individually format converted before transmission over said transmission link.

36. The dynamic range enhancing system of claim 24, said post-processing unit comprising:

means for receiving said second control signal; and means responsive to said received second control signal for adjusting said second signal adjusting means.

37. The dynamic range enhancing system of claim 36, said means for receiving comprising a signal demodulator.

38. The dynamic range enhancing system of claim 24, said post-processing unit comprising:

a plurality of digital tuners for concurrently processing said transmit signal and said control signal.

39. The dynamic range enhancing system of claim 38, said digital tuners comprising specified and programmable instantaneous center frequencies and bandwidths implemented in time domain representation using digital processing.

40. The dynamic range enhancing system of claim 38, said post-processing unit comprising:

a plurality of digital tuners for concurrently processing a plurality of transmit signals and a plurality of second control signals.

41. The dynamic range enhancing system of claim 24, said post-processing unit comprising:

means responsive to said second control signal for adjusting said second signal level adjusting means.

42. The dynamic range enhancing system of claim 24, said post-processing unit comprising a band pass filter for passing said transmit signal to said second signal level adjusting means.

43. The dynamic range enhancing system of claim 24, said post-processing unit comprising time delay means for compensating for processing time in said second signal level adjusting means.

44. The dynamic range enhancing system of claim 24, said post-processing unit comprising format converting means for converting said transmit signal from a digital signal to analog form.

45. The dynamic range enhancing system of claim 34, said post-processing unit further comprising means for splitting an analog signal and filter means for passing predetermined portions of the split signal.

46. The dynamic range enhancing system of claim 24, said second signal adjusting means comprising a gain controlled amplifier, in which a gain of said gain controlled amplifier is adjusted according to said second control signal.

47. The dynamic range enhancing system of claim 35, said post-processing unit comprising a plurality of format converting means for converting a digital signal into analog form, and a plurality of post-processing units for processing each of the plurality of format converted signals.

48. The dynamic range enhancing system of claim 34, said post-processing unit comprising:

a plurality of digital tuners for concurrently processing the combined transmit signals, said digital tuners comprising specified and programmable instantaneous center frequencies and bandwidths implemented in time domain representation using digital processing.

49. The dynamic range enhancing system of claim 35, said post-processing unit comprising:

a plurality of digital tuners for concurrently processing each individually format converted signals, said digital tuners comprising specified and programmable instantaneous center frequencies and bandwidths implemented in time domain representation using digital processing.

50. A dynamic range enhancing system for enhancing performance of a transmission link by controlling a transmit signal to be transmitted along a communication path comprising said transmission link, said transmission link extending from a first location to a second location remote from said first location, said system comprising:

a pre-processing unit, provided at said first location, that receives, as input, said transmit signal, said pre-processing unit comprising a first signal level changing device which changes a signal level of said transmit signal to be transmitted over said transmission link, and a transmitter which transmits said adjusted transmit signal over said transmission link; and a post-processing unit provided at said second location that receives, as input, said adjusted transmit signal transmitted over said communication link, said post-processing unit comprising a second signal level changing device which changes a signal level of said adjusted transmit signal transmitted over said transmission link, and a controller which controls said first signal level changing device and said second signal level changing device, such that the overall system gain is substantially constant, said controller comprising:

a detector which detects the signal level of said transmit signal at an input of said pre-processing unit;

a first generating device which generates a first control signal for controlling said first signal level changing device based on the signal level detected by said detector;

a second generating device which generates a second control signal which controls said second signal level changing device based on the signal level detected by said detector, said second control signal comprising a constant amplitude signal;

a signal combiner which combines said transmit signal and said second control signal before said transmit signal has been adjusted by said first signal level changing device, wherein said transmitter transmits said second control signal with said adjusted transmit signal over said transmission link to said post-processing unit.

51. The dynamic range enhancing system of claim 50, said system further comprising an A/D converter which converts an analog signal into a digital form, wherein said transmit signal is converted before being transmitted over said transmission link.

52. The dynamic range enhancing system of claim 50, said first signal level changing device comprising a gain controlled amplifier, wherein a gain of said gain controlled amplifier is adjusted according to said first control signal.

53. The dynamic range enhancing system of claim 50, wherein said transmission link comprises an analog transmission link.

54. The dynamic range enhancing system of claim 50, wherein said transmission link comprises a digital transmission link.

55. The dynamic range enhancing system of claim 54, said digital transmission link comprising a digital modulator which modulates said transmit signal with other signals for transmission over said transmission link and a digital demodulator which demodulates said transmit signal from the other signals for post-processing of said transmit signal.

56. The dynamic range enhancing system of claim 50, wherein said second generating device generates a constant amplitude RF carrier.

57. The dynamic range enhancing system of claim 50, said second generating device generating a constant energy signal.

58. The dynamic range enhancing system of claim 50, said pre-processing unit further comprises a time delay which compensates for processing time in said first signal level changing device.

59. The dynamic range enhancing system of claim 50, said pre-processing unit comprising a system data device which provides system data, including ancillary system control and supervision information, wherein said system data, carried by said control signal, is transmitted through said transmission link.

60. The dynamic range enhancing system of claim 50, said post-processing unit comprising:

a receiver which receives said second control signal;

a power detector/controller which detects an amplitude variation of said second control signal from a constant amplitude control signal, wherein said second signal level changing device is adjusted according to the determined amplitude variation.

61. The dynamic range enhancing system of claim 50, said post-processing unit further comprising a plurality of digital tuners for concurrently processing said adjusted transmit signal and said adjusted control signal.

62. The dynamic range enhancing system of claim 61, said digital tuners comprising specified and programmable instantaneous center frequencies and bandwidths implemented in time domain representation using digital processing.

63. The dynamic range enhancing system of claim 61, wherein said plurality of digital tuners concurrently process a plurality of transmit signals and a plurality of second control signals.

64. The dynamic range enhancing system of claim 50, wherein said post-processing is responsive to said second control signal and adjusts said second signal level changing device.

65. The dynamic range enhancing system of claim 50, said post-processing unit comprising a band pass filter for passing said adjusted transmit signal to said second signal level changing device.

66. The dynamic range enhancing system of claim 50, said post-processing unit comprising a time delay which compensates for a processing time in said second signal level changing device.

67. The dynamic range enhancing system of claim 50, said post-processing unit comprising a D/A converter which converts said adjusted transmit signal from a digital signal to analog form.

68. The dynamic range enhancing system of claim 50, said second signal level changing device comprising a gain controlled amplifier, in which a gain of said gain controlled amplifier is adjusted according to said second control signal.

69. The dynamic range enhancing system of claim 50, said transmission link comprises a diversity routing switch including a plurality of digital transmission links.

70. The dynamic range enhancing system of claim 53, said analog transmission link further extending between a pair of modems, a first modem being disposed between said pre-processing unit and said analog transmission link and a second modem being disposed between said post-processing unit and said analog transmission link, wherein said first modem converts digital signals from said pre-processing unit into analog form for transmission over said analog link and said second modem converts said transmitted analog signal into digital form for application to said post-processing unit.

71. The dynamic range enhancing system of claim 54, said digital transmission link comprising:

an analog transmission link further extending between a pair of modems;

a first modem being disposed between said pre-processing unit and said analog transmission link; and a second modem being disposed between said post-processing unit and said analog transmission link;

wherein said first modem converts digital signals from said pre-processing unit into analog form for transmission over said analog link and said second modem converts said transmitted analog signal into digital form for application to said post-processing unit.

* * * * *